United States Patent [19]

Chen et al.

[11] Patent Number: 5,658,659
[45] Date of Patent: Aug. 19, 1997

[54] MAGNETIC ALLOY AND METHOD FOR MANUFACTURING SAME

[75] Inventors: Tu Chen, Monte Sereno; Rajiv Yadav Ranjan, San Jose; Tsutomu Tom Yamashita, Milpitas; Miaogen Lu, Fremont; Keith Kadokura, Cupertino; John Ko-Jen Chen, Monte Sereno; Ting Joseph Yuen, Fremont, all of Calif.

[73] Assignee: Komag, Inc., Milpitas, Calif.

[21] Appl. No.: 286,653

[22] Filed: Aug. 5, 1994

Related U.S. Application Data

[63] Continuation of Ser. No. 189,088, Jan. 28, 1994, and a continuation of Ser. No. 223,636, Apr. 6, 1994.

[51] Int. Cl.$^6$ .................. G11B 5/66; B32B 5/16; C23C 14/00
[52] U.S. Cl. .................. 428/332; 428/336; 428/650; 428/662; 428/666; 428/668; 428/678; 428/694 T; 428/694 TS; 428/900; 204/192.22; 204/192.23; 204/192.15; 204/192.2; 204/298.12; 204/298.13
[58] Field of Search .................. 428/694 T, 694 TS, 428/900, 332, 336, 650, 666, 678, 668, 662; 204/192.22, 192.23, 192.15, 192.2, 298.12, 298.13

[56] References Cited

U.S. PATENT DOCUMENTS

| | | | |
|---|---|---|---|
| 4,554,217 | 11/1985 | Grimm et al. | 428/469 |
| 4,749,459 | 6/1988 | Yamashita et al. | 204/192.15 |
| 4,769,282 | 9/1988 | Tada et al. | 428/336 |
| 4,786,564 | 11/1988 | Chen | 428/694 TS |
| 4,837,094 | 6/1989 | Kudo | 428/694 |
| 4,973,525 | 11/1990 | Chien et al. | 428/692 |
| 4,988,578 | 1/1991 | Yamashita et al. | 428/678 |
| 5,062,938 | 11/1991 | Howard et al. | 204/192.2 |
| 5,066,552 | 11/1991 | Howard | 428/694 T |
| 5,162,158 | 11/1992 | Christner | 428/611 |
| 5,244,555 | 9/1993 | Allen et al. | 204/192.2 |
| 5,316,631 | 5/1994 | Ando | 204/192.2 |
| 5,352,501 | 10/1994 | Miyamoto | 428/65.7 |

FOREIGN PATENT DOCUMENTS

| | | | |
|---|---|---|---|
| 0413423 | 2/1991 | European Pat. Off. | G11B 5/64 |
| 0531035 | 3/1993 | European Pat. Off. | G11B 5/64 |
| 59-78518 | 5/1984 | Japan | 204/192.2 |
| 1046223 | 2/1989 | Japan | G11B 5/84 |
| 573880 | 3/1993 | Japan | G11B 5/66 |
| 5197944 | 8/1993 | Japan | G11B 5/66 |

OTHER PUBLICATIONS

H. Maeda "High coercivity Co and Co–Ni alloy films", J. Appl. Phys., vol. 53, No. 5, May 1982.

Williams and Comstock, "An Analytical Model of the Write Process in Digital Magnetic Recording", 17th Annual AIP Conf. Proc., Part I, No. 5, 1971, pp. 738–742.

Zhu et al., "Micromagnetic Studies of Thin Metallic Films", Journal of Applied Physics, vol. 63, No. 8, 1988, p. 3248.

Chen et al., "Physical Origin of Limits in the Performance of Thin–Film Longitudinal Recording Media", IEEE Trans. Mag., vol. 24, No. 6, 1988, p. 2700.

Chein, C.L., et al., "Magnetic Granular Fe–SiO$_2$ Solids", Journal of Applied Physics, vol. 61(B), 1987, p. 3311.

(List continued on next page.)

Primary Examiner—Leszek Kiliman
Attorney, Agent, or Firm—Jonathan A. Small

[57] ABSTRACT

Media according to the present invention is comprised of individual magnetic grains as small as 300 Å or smaller in diameter, which are uniformly spaced apart by a distance between 5 and 50 Å by a solid segregant. This media will typically exhibit coercivity and remanent coercivity squareness of at least 0.8 each, a switching field distribution of less than 0.2, and a coercivity of at least 1500 Oe (with a minimum required Pt content), while simultaneously providing the lowest media jitter noise for optimum magnetic performance. The media is deposited at a low partial pressure of water and in the presence of an optimum amount of contributant gas on a doped nucleation layer for grain growth control.

21 Claims, 21 Drawing Sheets

OTHER PUBLICATIONS

Liou, S.H., et al., "Granular Metal Films A Recording Media", Applied Physics Letters, vol. 52, No. 8, 1988, p. 512.

Shimizu et al., "CoPtCr Composite Magnetic Thin Films". IEEE Trans. Mag., vol. 28, No. 5, 1992, p. 3102.

Murdock et al., "Noise Properties of Multilayered Co–Alloy Magnetic Recording Media", IEEE Trans. Mag., vol. 26, 1990, pp. 2700–2705.

Yogi et al., "Longitudinal Media for 1 Gb/in$^2$ Areeal Density", IEEE Trans. Mag. vol. 26, 1990, p. 2271.

El–Hilo et al., "Interactions in CoPtCr/SiO$_2$ Composite Thin Films", IEEE Trans. Mag., vol. 29, No. 6, p. 3724 et seq. (Nov. 1993).

Thompson et al., "The Effects of Oxygen on Cobalt Titanium and Cobalt Platinum Thin Films", IEEE Trans. Mag., vol. MAG–22, No. 5, p. 635 et seq. (Sep. 1986).

MAGNETIC ALLOY AND METHOD FOR MANUFACTURING SAME

This is a continuation of U.S. patent application Ser. No. 08/189,088, filed Jan. 28, 1994, now pending, and U.S. patent application Ser. No. 08/223,636, filed Apr. 6, 1994, now pending, each of said applications being incorporated herein by reference.

FIELD OF THE INVENTION

The present invention relates generally to the manufacture of magnetic recording media used in rigid disc drives commonly used for computer data storage. In particular, the present invention is a method for vacuum deposition of a magnetic alloy onto a substrate in an extremely dry (i.e., low partial pressure of water) environment and under low argon pressure, on a specified nucleation layer with the addition of a selected segregant and a contributant gas to maintain the requisite high squareness and simultaneously lowest noise achievable in simple sputtering process.

BACKGROUND

Recording performance for magnetic disks is commonly determined by three basic characteristics—PW50, overwrite (OW), and noise. PW50 is the pulse width of the bits at half-maximum, expressed in either time or distance. A narrower PW50 allows for higher recording density, while a wide PW50 means that the bits are crowded together, resulting in adjoining bits interfering with one another. This interference is termed inter-symbol interference. Excessive inter-symbol interference limits the linear packing density of bits in a given track, hence reducing the packing density in a given area, and hence limiting the recording capacity of the magnetic media.

One means of reducing PW50 is to reduce the thickness of the magnetic layer of the media (the media being comprised of at least a substrate, a magnetic layer, an overlayer, and possibly additional layers). Another means of reducing PW50 is to increase hysteresis loop squareness ("S", including coercivity squareness "S*" and remanent coercivity squareness "S*$_{rem}$"), and narrow the switching field distribution ("SFD"), as described by William and Comstock in "An Analytical Model of the Write Process in Digital Magnetic Recording," A.I.P. Conf. Proc. Mag. Materials 5, p. 738 (1971). Yet another means for reducing the PW50 is to increase the coercivity ("Hc") of the media.

Overwrite ("OW") is a measure of the ability of the media to accommodate overwriting of existing data. That is, OW is a measure of what remains of a first signal after a second signal (for example of a different frequency) has been written over it on the media. OW is low, or poor when a significant amount of the first signal remains. OW is generally affected by the coercivity, the squareness, and the SFD of the media. For future high density recording, higher Hc media will be preferred. However, gains in He are generally accompanied by losses in OW. Thus, there is a need in the art to improve the S* and the SFD to obtain improvements in OW.

Noise performance of a magnetic film is typically defined in terms of read jitter and write jitter. Read jitter is primarily determined by the amount of signal available from a bit, and the electronic noise in the channel. A thicker magnetic film will typically provide reduced read jitter. Unlike read jitter, write jitter is determined by the intrinsic noise of the film. Intrinsic media noise has been theoretically modeled by Zhu et al. in "Micromagnetic Studies of Thin Metallic Films", J. Appl. Phys., vol. 63, no. 8, p. 3248 (1988), which is incorporated by reference herein. Chen et al. describe the source of intrinsic media noise in "Physical Origin of Limits in the Performance of Thin-Film Longitudinal Recording Media," IEEE Trans. Mag., vol. 24, no. 6, p. 2700 (1988), which is also incorporated by reference herein. The primary source of intrinsic noise in thin film media is from interparticle exchange interaction. In general, a higher interparticle exchange results in higher S* and lower SFD due to the co-operative switching of magnetic grains. However, a high exchange interaction results in high noise.

The noise from interparticle exchange interaction can be reduced by isolating the individual particles (grains). This may be accomplished by physically spacing the grains apart from one another as described by Chen et al. in the aforementioned "Physical Origin of Limits in the Performance of Thin-Film Longitudinal Recording Media". The amount of separation need be only a few angstroms for there to be a significant reduction in interparticle exchange interaction.

There is another interparticle interaction, called magnetostatic interaction, which acts over a much greater distance between particles as compared to the exchange interaction. Reducing the magnetostatic interaction does reduce intrinsic media noise slightly. However, the effects of magnetostatic interaction actually improve hysteresis loop squareness and narrow the switching field distribution (but to a lesser extent than the exchange interaction), and hence improve PW50 and OW. Therefore, magnetostatic interaction is generally desirable and hence tolerated.

In order to obtain the best performance from the magnetic media, each of the above criteria—PW50, overwrite, and noise—must be optimized. This is a formidable task, as each of these performance criteria are inter-related. For example, obtaining a narrower PW50 by increasing the Hc will adversely affect overwrite, since increasing He degrades overwrite. A thinner media having a lower remanent magnetization-thickness product ("Mrt" where Mr is the remanent magnetization and t is thickness of the magnetic layer) yields a narrower PW50 and better OW, however the read jitter increases because the media signal is reduced. Increasing squareness of the hysteresis loop contributes to narrower PW50 and better OW, but may increase noise due to interparticle exchange coupling and magneto static interaction. Since it is a known goal to reduce or eliminate interparticle exchange coupling, the amount that PW50 may be narrowed and OW improved has heretofore been limited by the increase in tolerable noise level arising from the magnetostatic interaction of the media.

Therefore, an optimal thin film magnetic recording media for high density recording applications, i.e., that can support high bit densities, will require low noise without adversely sacrificing PW50 and OW. Recording density can then be increased since bit jitter is reduced. One type of magnetic media which has allowed optimizing certain of the above performance criteria is based on alloys of cobalt (Co) and platinum (Pt), due to the alloys' ability to provide high Hc and high magnetic moment.

The media noise of CoPt based alloys can be reduced by a number of different approaches, but as described in the following, these methods suffer from loss of hysteresis loop squareness (i.e., lower S* and higher SFD), increased PW50, decreased OW, and other disadvantages. One such approach teaches about deposition of the magnetic alloy by sputtering in a high argon pressure environment, as has been described by Chen et al. in the aforementioned "Physical Origin of Limits in the Performance of Thin-Film Longitudinal Recording Media". Basically, the application of high argon pressure results in isolated, exchange decoupled grains. Although the media noise is reduced, S* and OW decreased, and SFD increased resulting in an increase in PW50.

In another approach, in order to decrease the media noise, it is known to introduce oxygen into the magnetic film in a concentration of 5 to 30 atomic percent (at. %), as taught by Howard et al. in U.S. Pat. No. 5,066,552, (see also Howard et al.'s U.S. Pat. No. 5,062,938, which teaches oxidizing the magnetic grains after growth). Howard et al. teach the formation of a magnetic layer by vacuum sputtering in an argon atmosphere into which oxygen has been introduced. Oxygen is therefore introduced into the magnetic layer from the sputtering environment. However, as pointed out by Howard et al. in said patent, introducing oxygen decreases both Hc and S*.

There are a number of disadvantage to the approaches taught by Howard et at. ('938) First, the additional step of oxidizing a sputtered layer after depositing an impurity adds to the manufacturing complexity and cost. Second, Howard et al. teaches nothing about controlling the formation of the oxides. Third, Howard et al. teaches nothing about controlling the grain size and grain uniformity.

Yet another approach is to make granular films having grains of magnetic alloys containing $SiO_2$. Details about these films have been described by C. L. Chien et al. in "Magnetic Granular Fe—$SiO_2$ Solids", J. Appl. Phys., 61(B), p. 3311 (1987), and S. H. Liou et al. in "Granular Metal Films a recording Media", Appl. Phys. Lett., 52(8), p. 512 (1988). Essentially, these researchers were depositing Fe—$SiO_2$ either by co-sputtering or by using composite targets and the magnetic films were deposited without underlayers. The values for Hc of around 1100 Oe and for squareness of around 0.6 were obtained. These values are unacceptably low for high density recording applications.

Similarly, addition of $SiO_2$ has been exploited by Shimizu et al. as described in "CoPtCr Composite Magnetic Thin Films", IEEE Trans. Mag., vol. 28, no. 5, page 3102 (1992), and its companion patent applications: European Patent Application 0 531 035 Al, published Mar. 10, 1993, and Japanese Patent Application 5-73880, published Mar. 23, 1993. Specifically, lower media noise and higher in-plane coercivity were noted with an introduction of approximately 10% by volume (vol. %) $SiO_2$. The S* of these films were generally around 0.6, as discussed in the aforementioned paper of Shimizu et al. Thus, although media including $SiO_2$ showed lower media noise and higher Hc, the squareness obtained was again too low to meet the requirements for high density recording. It should also be noted that Shimizu et al. required approximately 17–18 at. % of Pt in the alloys. Such high percentage of Pt significantly increases the manufacturing cost of such media (although for media designed for use with magneto-resistive heads, e.g., having an Mrt of about 1.0 memu/$cm^2$, a higher platinum content, such as 18%, may be required to maintain Hc). Furthermore, it should be noted that Shimizu et al. achieved a peak Hc of 1700 Oe, an unacceptable limit for future high density recording applications.

Another approach, as discussed in Japanese Patent Application 5-197944, published Aug. 6, 1993 (Murayama et al.) is use of $SiO_2$ for increased Hc while sputtering in the presence of a broad range of $N_2$, for example 0.1 to 10% on a NiP under layer. Lower media noise was obtained, but at the cost of decreasing S* as the percentage of $SiO_2$ increased. Thus, lower media noise was obtained at the cost of increasing PW50 and OW. Additional teachings relating to $SiO_2$ may be found in U.S. Pat. Nos. 4,837,094 to Kudo (teaching an amorphous alloy) and 4,769,282 to Tada et al. (teaching an alloy including rare earth elements). Importantly, all of the references to $SiO_2$ teach alloying or admixing the $SiO_2$ with the magnetic film constituents, as opposed to depositing $SiO_2$ and the magnetic film constituents under conditions such that there is co-deposition but only minimal alloying of the $SiO_2$ with the magnetic film material.

There are a number of disadvantages to the alloying or admixing of impurities, for example as taught by Shimizu et al. First, the addition of an impurity material (e.g., up to 30 vol. % $SiO_2$ by Shimizu et al.) results in a decrease in Ms and hence a decrease in Mr. Therefore, the thickness of the magnetic layer must be increased to maintain sufficient Mrt. This is undesirable because an increase in film thickness is generally accompanied by an increase in space loss between the head and the media, which results in a larger PW50 and worse OW. Second, the sputtering process is made more complex and more costly by the requirement that additional materials be sputtered. Third, the alloyed or admixed impurity does nothing to increase grain isolation to thereby reduce exchange coupling induced noise.

Murdock et al. in "Noise Properties of Multilayered Co-Alloy Magnetic Recording Media", IEEE Trans. Mag., vol. 26, p. 2700–2705 (1990) teach deposition of multiple layers of magnetic material isolated from each other by layers of nonmagnetic material to reduce media noise. It is theorized that grain size and distribution may be relatively controlled several grains in thickness above an under layer. As a film grow thicker, the grains tend to vary in size and position. Thus, Murdock et al. teach controlling grain size and spacing by deposition of an under layer, forming a thin magnetic layer thereon several grains in thickness, forming on this magnetic layer another under layer, forming on that under layer another thin magnetic layer, and so on. Although media noise is reduced due to smaller isolated grains, the SFD is increased and the squareness is reduced due to a difficulty in matching the Hc of the individual layers.

Moreover, the grain size of the thinner magnetic layers may be reduced so much that the magnetic grains may become superparamagnetic, resulting in a dramatic decrease in Hc. Manufacturing of such multilayered films is also very difficult and requires additional process chambers over current equipment requirements. In addition, special attention is needed to design the manufacturing process to minimize oxidation of thinner magnetic layers. Thus, although the multi-layer approach does teach a method for reducing media noise, the squareness degrades and the process is difficult and expensive.

Currently, there are recognized limits on the ability to obtain high squareness and low media noise simultaneously. This is especially true with regard to isotropic media. This problem has lead to compromises in the values of the magnetic performance parameters, ease and cost of manufacturing, etc., for longitudinal recording media for high recording density. See, for example, Yogi et al., "Longitudinal Media for 1 Gb/$in^2$ Areal density", IEEE Trans. Mag., vol. 26, page 2271 (1990). Therefore, there is at present a need in the art for a method of reducing media noise without compromising other media performance characteristics such as high coercivity, high squareness (high S* and lower SFD), high SNR, high overwrite, and low PW50. This is becoming crucial for high density applications as recording densities approach (or exceed) 10 Gb/$in^2$.

SUMMARY OF THE INVENTION

The present invention solves the problems and needs of the art by providing a magnetic recording media, and method for manufacturing same, such media having high coercivity and high hysteresis squareness and optimized to provide superior magnetic recording parameters such as PW50, intrinsic media noise, bit shift, and OW in high density applications. The method of manufacturing such media comprises a system of vacuum deposition operating conditions and steps which yield such an optimized media.

Control of grain growth and structure is a key aspect of the present invention. Media according to the present invention is comprised of individual magnetic grains which are isolated from one another by a solid segregant, and which have a controlled size and spacing. This media will typically exhibit coercivity squareness and remanent coercivity squareness of at least 0.8 each, a switching field distribution of less than 0.2, and a coercivity of at least 1500 Oe (with a minimum required Pt content), while simultaneously providing the lowest media jitter noise for optimum magnetic performance. The media exhibits a high degree of in-plane anisotropy. Therefore, this media is ideally suited for current and future high storage density applications such as use with magneto-resistive heads.

Results of our research indicate that the basic unit of thin film magnetic recording media is a grain, which is comprised of one or more individual crystals. The crystals within a grain exhibit high exchange coupling, so that the magnetic moments of the grains are perfectly aligned with one another. We have found that in order to minimize intrinsic media grain noise while maintaining high hysteresis squareness each grain should be comprised predominantly of a single crystallite and be of small size, and that all grains should be of a uniform size. In addition, we have found that the grains should be uniformly spaced apart from one another by an isolating material to completely eliminate exchange coupling and reduce write related jitter noise attributed thereto.

On top of the dominant contribution of exchange coupling and minor contribution of magnetostatic interaction to the write jitter noise, we have discerned a third contribution related to grain size. The noise contribution from grain size (herein called "grain noise") is a consequence of the formation of transition boundaries along grain boundaries. Consequently, large grains or clusters of non-separated grains produce a more jagged, or zig-zag grain boundary line, and thus a more jagged, or zig-zag transition boundary than small grains. The jaggedness of the transition boundaries results in grain noise. For future high recording densities, as bit size decreases, the contribution of the grain size to write jitter noise will play a very important role. Thus, the ability to provide uniformly small grain size is an important aspect of the present invention.

The results of our research further indicate that use of a proper nucleation layer beneath the recording layer is critical to obtaining the uniform grain size and spacing necessary for high coercivity squareness and low noise. The function of this nucleation layer is to provide nucleation sites to which individual magnetic grains will adhere. The grain size and spacing are significantly dictated by the initial growth conditions. Since magnetic grains will form at nucleation sites, controlling the size of each nucleation site and the spacing between adjacent nucleation sites will provide the facility for controlling the grain growth characteristics of size and spacing. In addition, proper control of the size and spacing of the magnetic grains provides a method for optimizing the segregation of segregant material (discussed below) at the magnetic grain boundaries.

Accordingly, it is important to distinguish between an undoped under layer, which may or may not provide nucleation sites, and a nucleation layer. An undoped under layer does not necessarily provide the aforementioned nucleation sites, and certainly is not optimized for subsequent magnetic grain growth. Thus, the layers of material such as undoped NiP taught by the prior art will be referred to as under layers, while layers such as compounds of Ni and P alloyed with selected dopants, such as certain oxides or nitrides, as taught by the present invention, will be referred to as nucleation layers. The laid open Japanese Patent Application 5-73880, and its EPO equivalent discussed above (Shimizu et al.) and laid open Japanese Patent Application 5-197944 (Murayama et al.) each discuss use of an underlayer, but fail to suggest or even recognize the importance of the grain growth mechanism provided by a nucleation layer. In fact, Shimizu et al. generally set about to form their magnetic media without use of any type of under layer and Murayama et al. focuses on the addition of $SiO_2$ to the recording layer material to overcome the limited benefit provided by an NiP under layer.

In accordance with the present invention, the nucleation layer will typically be a compound of Ni and P to which is added a dopant, for example up to 10 percent by weight (wt. %) (sputtered from a common or separate sputter targets). The nucleation layer will typically be amorphous, crystalline or a mixed phase structure. Each grain of the nucleation layer is defined by a boundary. The dopants are typically selected from the group consisting of oxides and nitrides of Al, Ti, Hf, Zr, Si, and Ta. One specific nucleation layer is comprised of $Ni_3P$ together with 2 wt. % $TiO_2$. Other typical examples for the nucleation layer include $Ni_3P$ alloyed together with 2%, 3% or 4% $Al_2O_3$. While a compound of Ni and P together with a dopant is one example of a nucleation layer composition, we believe that oxide or nitride doped elements or compounds other than NiP will also provide the desired results.

We have also discovered certain deposition conditions which are critical to obtaining media with optimized magnetic parameters. For example, we have discovered that maintaining a low partial pressure of $H_2O$ in the deposition system yields a significant reduction in grain "clustering." The presence of $H_2O$ in the system appears to result in oxidation of the grains. This oxidation results in a grain constituted of several crystallites clustered together. These clusters exhibit non-uniform switching during magnetization reversal, resulting in poor squareness and higher intrinsic grain noise. Importantly, the low partial pressure of $H_2O$ must be maintained during the sputtering process—referred to herein as steady state partial pressure. We have found that an $H_2O$ partial pressure of less than $5 \times 10^{-5}$ Torr, and preferably less than $1.2 \times 10^{-05}$ Torr, as monitored by residual gas analysis (RGA), is preferred during deposition. Once again, the prior art such as Shimizu et al., Howard, and Murayama et al. each fail to recognize the importance of controlling the partial pressure of $H_2O$.

In addition, we have also found that deposition of the magnetic film at relatively low argon sputtering pressures results in predominantly single crystal grains. For example, a sputtering pressure of 20 mTorr or lower in an RF or RF/DC sputtering system significantly reduces the clustering of the magnetic crystallites and enhances the uniformity of particle size and distribution.

We have also discovered that although a dry ambient and high vacuum condition provides uniform grain structure having minimal clustering, these conditions generally change the initial growth mechanism of the magnetic alloy, resulting in more columnar growth structures which favor the out of plane c-axis (easy axis of magnetization). Such media is not well suited for longitudinal recording. According to the present invention, a known amount of what is referred to herein as a contributant gas, examples of which include $N_2$, $O_2$, NO, $N_2O$, CO, and $CO_2$, is introduced during sputtering of the media, in a dry ambient and a high vacuum, to ensure the initial growth conditions which result in a predominantly in-plane anisotropy and to simultaneously facilitate the crystal grains growing separately from each other with a large angle grain boundaries. In addition, the squareness S* of the magnetic media is further enhanced to greater than 0.8, by adding an optimum mount of the contributant gas to the sputtering system during deposition. It should be noted that the exact percentage of contributant gas added to the sputtering environment depends ultimately on the type of contributant gas used, the magnetic alloy (and purity of the target), the composition of the underlayer, and the vacuum condition.

In addition, the magnetic recording media is manufactured by a deposition technique in which a nonmagnetic segregant material, such as an oxide or nitride of As, B, Ce, Co, Cr, Dy, Gd, Ho, La, Lu, Ni, Os, Pm, Ru, Re, Sc, Se, Si, Sm, Sn, Ta, Tb, Th, Ti, Tin, U, V, W, Y, or Zr, is deposited together with the magnetic material. In a single deposition step, without post deposition treatment, the segregant material must uniformly diffuse to the grain boundaries to provide sufficient isolation between grains without adversely affecting the intrinsic magnetic properties such as magnetization and coercivity. In order to accomplish this, the segregant material is insoluble in the magnetic alloy, and is thermodynamically stable. The stability of these insoluble compounds are determined based on their bond strength, which should be at least greater than 90 Kcal/mol.

While the concentration of the segregant material in the deposited media must be sufficient to completely separate each individual magnetic grain at the grain boundaries (thereby minimizing media noise from intergranular exchange coupling), there is an upper limit to the amount of segregant which can be incorporated in the magnetic film. This upper limit is a function of the decrease in coercivity, a decrease in saturation magnetization, and/or squareness caused by the addition of segregant material. Typically, a target coercivity and/or squareness will be identified, and the amount of segregant will be selected such that the coercivity and/or squareness are maintained at or above their target values. Typically, the amount of segregant material added will be at about or below 10 molar percent (mol. %). Importantly, however, in order that the segregant materials segregate to the grain boundaries of each magnetic grain, the aforementioned mechanisms which cause clustering of the magnetic grains and crystals must be suppressed, and the large grain boundaries must be provided to facilitate segregation.

The effects of the introduction of the segregant and contributant gas in a dry sputtering environment according to the present invention are greatly enhanced by employing the aforementioned nucleation layer under the magnetic layer. We have found that in order for the segregant to be effectively segregated at the grain boundaries in a dry sputtering environment and low argon pressure, the deposited magnetic film must be provided with large grain boundaries at an initial stage of grain growth. Selection of the proper nucleation layer provides the requisite large grain boundaries, while simultaneously providing control over grain size and grain spacing. Therefore, growth of the magnetic recording layer on an appropriate nucleation layer is critical to (a) facilitate the introduction of segregant at the grain boundaries, (b) control the grain size, and (c) control the grain spacing in the magnetic recording layer.

In addition, we have found that the introduction of a controlled mount of a selected contributant gas, such as nitrogen, oxygen, CO, $CO_2$, etc., in addition to providing in-plane anisotropy, provides an enhanced grain separation at the initial stages of grain growth. Thus, the presence of such a contributant gas facilitates the introduction of the segregant material at the grain boundaries.

The resulting additional material such as the stable insoluble compound in the magnetic layer and sputtering conditions have a minimal impact on the magnetic layer's saturation magnetization Ms and magnetic remanence Mr. High remanent squareness is achieved, and hence there is minimal impact on the overall thickness of the magnetic layer. Importantly, exchange coupling induced noise can be completely suppressed by the introduction of the segregant material and other steps of the present invention. Simultaneously, a high coercivity, for example 1500 Oe or greater, and high coercivity squareness and remanent coercivity squareness, for example greater than 0.8 each, are obtained.

Therefore, a greatly improved media which is best suited for future high density recording applications is provided by sputtering a magnetic recording layer containing a segregant material onto a doped nucleation layer in a dry sputtering environment at a low sputtering pressure in the presence of a contributant gas. The resulting magnetic layer exhibits predominantly single crystallite grains of small and uniform size which are uniformly spaced apart from one another by the segregant material at the grain boundaries. The method of the present invention provides control over the resulting media's recording performance characteristics, and adds little additional complexity or cost to an existing sputtering process.

BRIEF DESCRIPTION OF THE DRAWINGS

The present invention will be described in greater detail below, including specific examples thereof, with regard to the figures, in which.

As between each of these figures, like reference numerals shall denote like elements.

DETAILED DESCRIPTION

Figure 1:
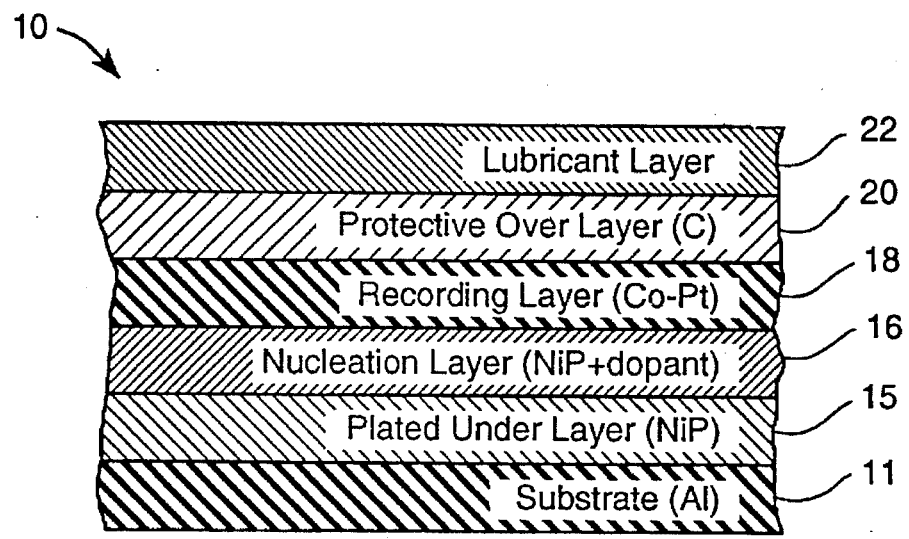
FIG. 1 is a cross section of a rigid thin-film magnetic disk constructed in accordance with the present invention.

FIG. 1 is a cross section (not to scale) of a typical rigid thin-film magnetic disk 10 constructed in accordance with the present invention. A general description of the complete disk 10 will be presented below, followed by a detailed description of certain of the layers thereof and the methods and conditions for their deposition. Finally, a detailed description of several examples will be presented to highlight various of the important aspects of the present invention.

Disk 10 consists of an aluminum alloy substrate 11 onto which a plated layer 15, typically of NiP, is formed by electroless plating or other methods well known in the art. Layer 15 typically has a thickness in the range of 5 to 15 μm. The plated layer 15 of NiP provides strong mechanical support on the relatively soft aluminum substrate 11. After layer 15 is plated onto substrate 11, the disk is polished, textured, and cleaned. Although the embodiment detailed herein employs an aluminum substrate, media based on other substrate materials such as glass, Memcor (a Trademark for a Corning proprietary glass ceramic material), carbon-based materials, silicon, titanium, stainless steel, etc., are equally within the contemplation of the present invention.

A nucleation layer 16, described in further detail below, is then deposited onto layer 15. Sputtering is the preferred method of depositing nucleation layer 16, although other methods of deposition may accomplish the desired goal of formation of this layer. Typically, sputtered nucleation layer 16 is in the range of 5 to 100 nm thick.

A recording layer 18 comprising a magnetic alloy and an insoluble "stable" segregant material, described in further detail below, is then deposited on nucleation layer 16. Again, sputtering is a preferred method for deposition of this layer, although other techniques are available to accomplish the goal of deposition of this layer.

Finally, a protective over layer 20 of a type known in the art, e.g., of hydrogenated carbon, or oxides such as $ZrO_2$, $SiO_2$, etc., or nitrides such as TiN, ZrN, etc., or carbides such as TiC, SiC, etc., of a thickness for example less than 300 Å, and a lubricant layer 22 of a type known in the art, e.g., a solid or liquid lubricant, are applied over layer 18. Details of the protective over layer 20 and lubricant layer 22 are beyond the scope of the present invention, and therefore are not discussed in detail herein.

Figure 2:
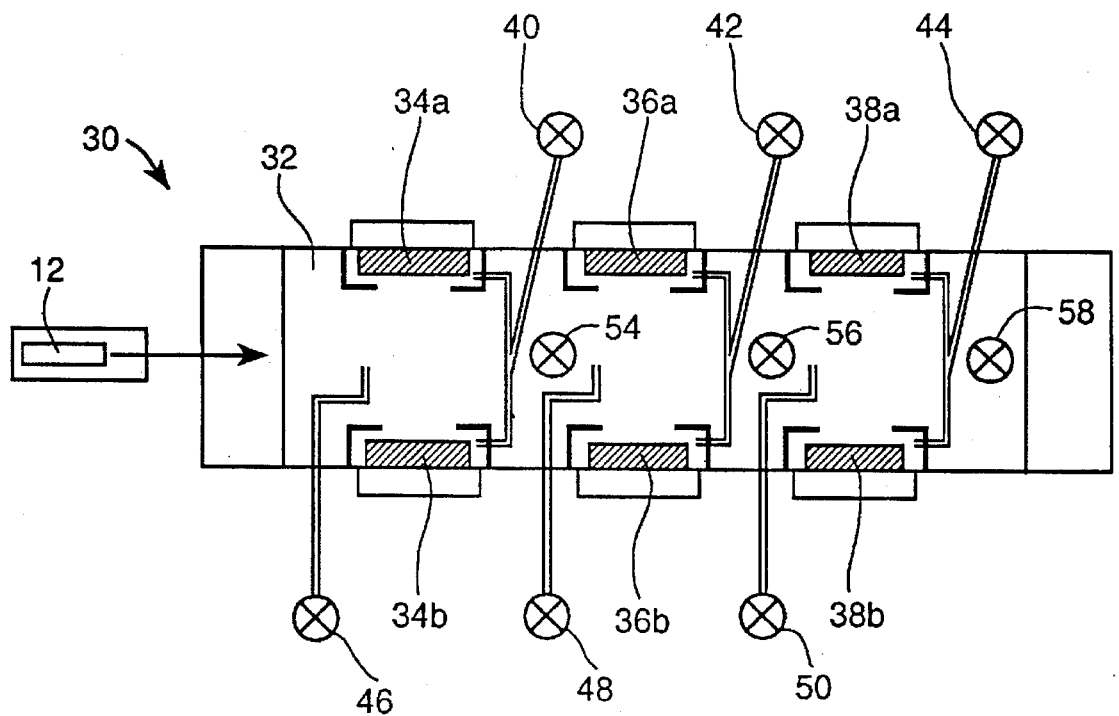
FIG. 2 is a schematic illustration of a sputtering apparatus of the type employed by the present invention.

In one embodiment of the present invention layers 16, 18, and 20 were sputtered in an in-line sputtering apparatus 30 of the type schematically shown in FIG. 2. Apparatus 30 includes a chamber 32 into which a substrate 11 is placed. Substrate 11 is mechanically coupled to a disk pallet carrier for example as described in U.S. Pat. No. 5,244,555 (Allen et al.) which moves substrate 11 past first, second, and third pairs of targets 34a, 34b, 36a, 36b, 38a, and 38b for double sided sputtered media. Targets 34a and 34b are used to sputter nucleation layer 16 onto substrate 11, and targets 36a and 36b are thereafter used to sputter recording layer 18 onto nucleation layer 16. Each of these pairs of targets will be discussed in further detail below. Targets 38a and 38b are thereafter used to sputter over layer 20 onto layer 18.

Apparatus 30 also includes gas sources 40, 42, and 44 for introducing selected gases such as argon, krypton, etc., into the vicinity of targets 34a and 34b, 36a and 36b, and 38a and 38b respectively. Gas evacuation pumps 54, 56, and 58 are provided to remove gas from the vicinity of targets 34a and 34b, 36a and 36b, and 38a and 38b respectively.

In order to achieve the specific goals of the present invention, a CoPt-based magnetic alloy is deposited together with an insoluble segregant material from targets 36a and 36b. In one embodiment, the CoPt is alloyed with Ni. In this embodiment, the platinum concentration is between about 5 and 20 at. %, the nickel and/or chromium concentration is up to about 15 at. %, and the cobalt concentration is greater than about 75 at. %. In another embodiment, the CoPtNi is alloyed with Ta and/or Ti in a concentration of about 10 at. % or less. Cr may also be introduced, for example in a concentration up to about 3 at. %. Media having this type of recording layer is disclosed in further detail in applicant's copending U.S. patent application Ser. No. 08/188,954, which is incorporated by reference herein.

As has been described, a primary source of media noise is intergranular exchange coupling. As discussed by Chen et al. in the aforementioned "Physical Origin of Limits in the Performance of Thin-Film Longitudinal Recording Media," one method of reducing coupling noise is to isolate the grains of the recording layer from one another. This is the role of the insoluble segregant material. Various materials, such as oxides and nitrides of As, B, Ce, Co, Cr, Dy, Gd, Ho, La, Lu, Ni, Os, Pm, Ru, Re, Sc, Se, Si, Sm, Sn, Ta, Tb, Th, Ti, Tm, U, V, W, Y, and Zr are effective for grain isolation. The selection criteria for the segregant material is that firstly, it should be relatively insoluble in the magnetic alloy such that it segregates to the grain boundaries, and secondly, it should be stable as determined by the binding energy of the compound which should be greater than at least 90 Kcal/mol. for $D°_{298}$ (as described in the Handbook of Chemistry and Physics, 69th ed., CRC Press, 1988–89). For a more detailed discussion of CoO and other related segregant materials, the aforementioned U.S. patent application Ser. No. 08/223,636. It should be noted that in the following description and associated figures, CoO and $SiO_2$ are used as examples of the insoluble "stable" segregant. However, one or more of many such insoluble "stable" segregants are within the contemplation of the present invention.

The alloy comprising recording layer 18 may also include other elements selected from the group consisting of B, P, C, N, Zr, Hf, V, W, Re, and Si. One or more of these elements may be selected to optimize one or more of the performance parameters of the recording layer, and the specifics of the selection criteria are beyond the scope of the present invention. In general, however, the sum of the Ta, Ti, Cr, and/or other elements listed above should not exceed about 20 at. % of the total alloy so as to maintain high Ms. As will be appreciated by one skilled in the art, the exact amounts of the various constituents may be adjusted, above or below the cited ranges, in order to optimize one or more attributes of the resulting media. Furthermore, the CoPt-based alloy and the segregant material me be deposited from a single sputtering target or separate sputtering targets (co-sputtered) as appropriate.

Figure 3:
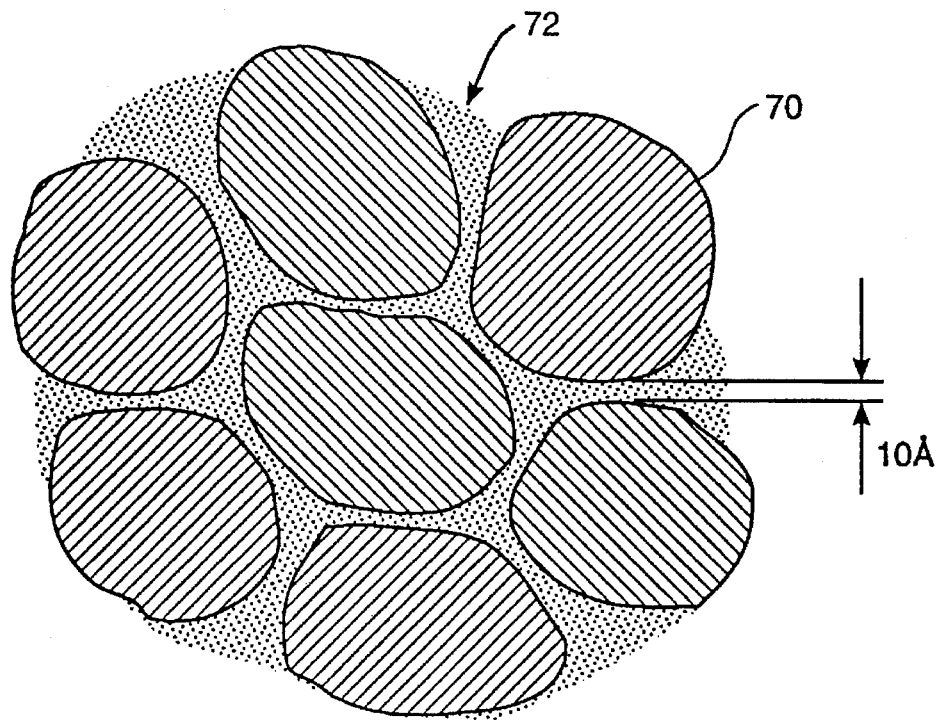
FIG. 3 shows a schematic illustration of the microstructure of a magnetic medium, in plan view, having minimal media noise and extremely high squareness according to the present invention.

As previously stated, optimal recording performance may be obtained when the grains comprising the recording layer are uniform is size and uniformly spaced apart by segregant material. This is illustrated in FIG. 3. In fact, we have found that it is extremely important that each of the magnetic grains 70 should be a single crystallite of nearly identical size, uniformly isolated from one another by insulating material 72 to break intergranular exchange. For future high density recording applications, for example 10 $Gb/in^2$, the maximum allowable write jitter is expected to be on the order of only 4 to 10 nm. We believe that grain size of media for such applications will be as small as 100 Å or smaller. Thus, we have discovered that in order to achieve performance targets for such media, the individual grains 70 must be uniformly isolated by between about 5 to 50 Å, with a standard deviation of spacing equal to or less than about 10 Å, preferably 20 Å±10 Å, with an insulating material 72 of a thickness around 10 Å disposed between grains to eliminate the exchange interaction yet support the highest write density. Media having such a recording layer will exhibit the highest possible squareness while maintaining the lowest possible media noise, as required for future high recording density applications.

We have discovered that one requirement for obtaining such a recording layer is that the recording layer be formed on a specific nucleation layer 16. A nucleation layer affects the size and spacing of the magnetic grains formed thereupon, and facilitates the uniform distribution of the segregant between the grains to provide the necessary isolation to minimize or prevent intergranular exchange coupling for reduced noise and improved magnetic performance. To accomplish this, the nucleation layer should have a topology of discrete nucleation sites to which individual grains will adhere.

Figure 4:
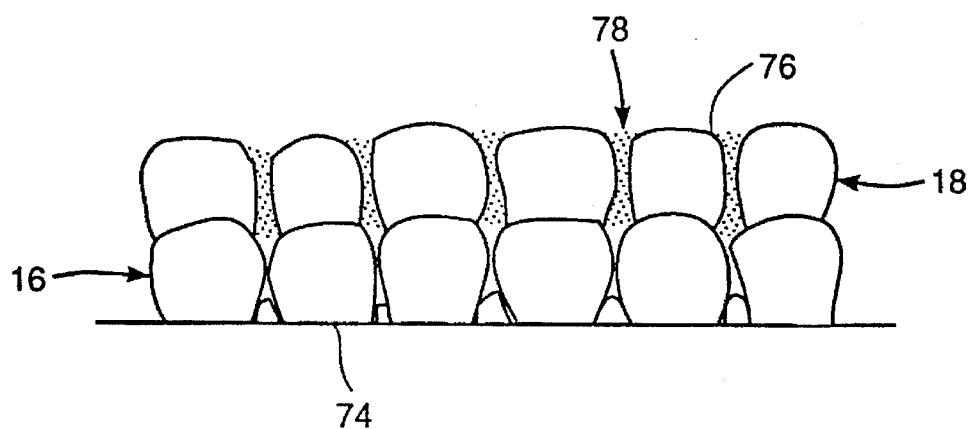
FIG. 4 shows in cross-section the microstructure of the magnetic medium of FIG. 3.

Therefore, the nucleation layer should be sufficiently thick (for example, about 100 Å or thicker) to uniformly and completely cover the substrate surface (to eliminate, for example, residual effects from cleanlines, etc.), yet not so thick as to cause the degradation of the desired grain size, distribution, and uniform separation provided by the nucleation sites. A cross section of such a microstructure of a magnetic disk is shown in FIG. 4, in which nucleation layer 16, consisting of discrete nucleation sites 74, forms the foundation for recording layer 18, consisting of individual magnetic grains 76 with segregant material 78 dispersed therebetween.

Nucleation layer 16 should be a nonmagnetic material, preferably amorphous. We have performed numerous experiments on media with and without a nucleation layer, measuring coercivity as a function of the percentage of nitrogen gas introduced into the sputtering chamber (as discussed in detail, for example, in applicant's copending U.S. application Ser. No. 08/189,088, which is incorporated herein by reference).

Figure 5:
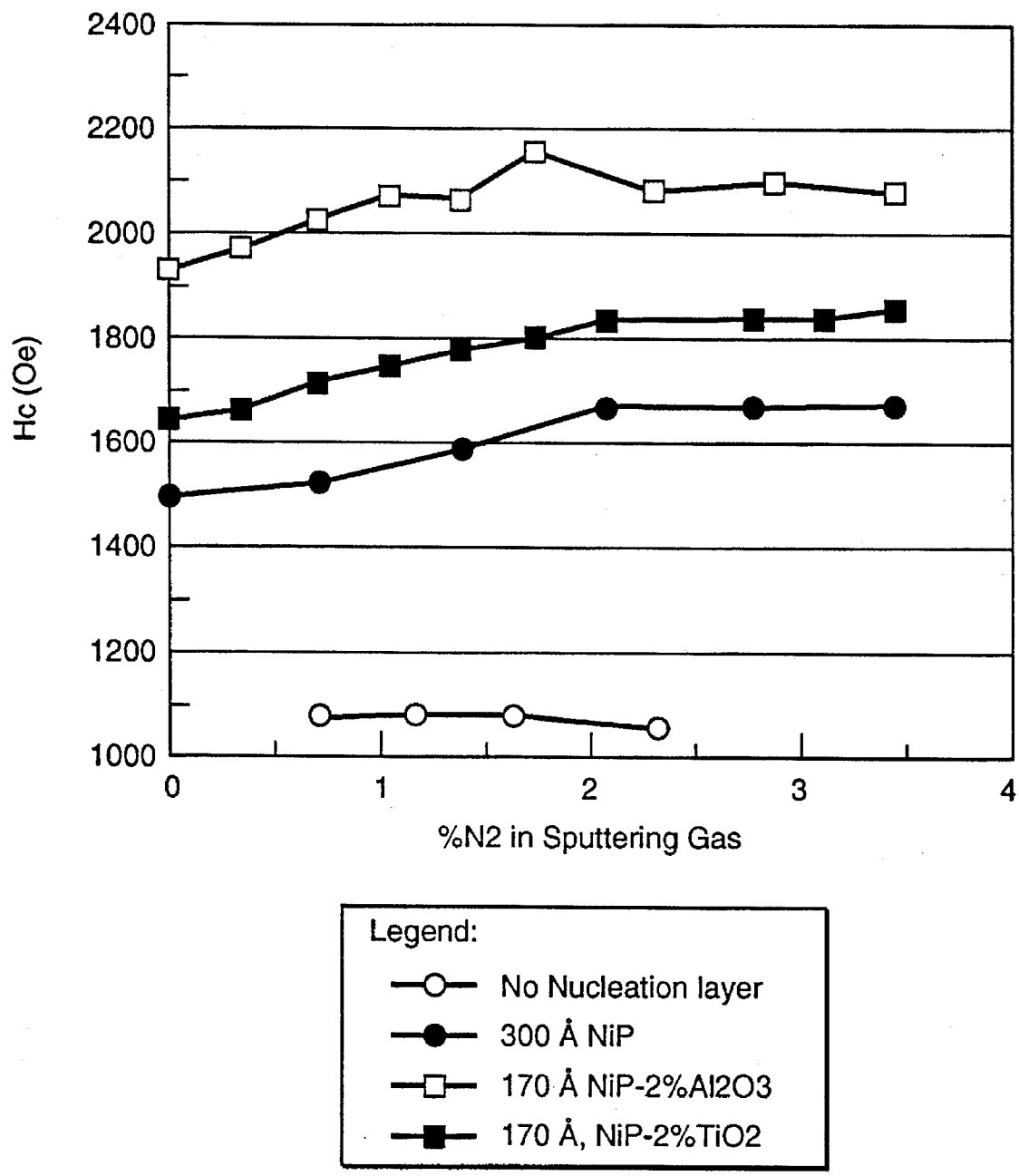
FIG. 5 shows the effect of $N_2$ gas addition on the Hc of $CoNi_7Pt_{12}Ti_1Ta_3Pt_{12}$-4%$SiO_2$ media sputtered over nucleation layers having different amounts and types of dopants.

FIG. 5 shows the results of certain of these experiments. Initially, we measured the Hc of a recording layer 18 of the alloy $CoNi_7Ti_1Ta_3Pt_{12}$ (throughout the following, the subscripts represent the atomic percent of each element in the alloy, for example 12 at. % Pt, and the missing subscript denotes the balance of the alloy) having 4 mol. % $SiO_2$ sputtered without a nucleation layer. The material was RF diode sputtered at about 3.0 $W/cm^2$ and about 15 mTorr of argon from targets 36a and 36b (FIG. 2). The deposited recording layer 18 was approximately 25 nm thick. The results indicate that Hc reached a maximum of about 1050 Oe. While increasing coercivity may otherwise be accomplished by increasing the platinum content of the alloy and admixture of $SiO_2$ as taught by Shimizu et al., the maximum coercivity obtained for this media having a magnetic layer thickness of about 500 Å (which we estimate has an Mrt of about 2.25 $memu/cm^2$) was 1700 Oe (and that result was obtained with 18% Pt and 10 vol. % $SiO_2$). The present invention achieves much higher Hc with much less Pt (therefore dramatically reducing cost) and less $SiO_2$ (therefore maintaining high Ms).

Also shown in FIG. 5 are the measurements of Hc of the alloy $CoNi_7Ti_1Ta_3Pt_{12}$ having 4 mol. % $SiO_2$ sputtered first on a nucleation layer of NiP doped with 2% $Al_2O_3$ (generally denoted herein as NiP-2%$Al_2O_3$) and second on a nucleation layer of NiP-2%$TiO_2$. The nucleation layer was approximately 38 nm thick, sputtered at 15 mTorr of argon gas from targets 34a and 34b (FIG. 2). As can be seen, coercivity of at or above 2000 Oe are achieved, using only 12 at. % platinum in the magnetic alloy. This results in an easily manufacturable high coercivity media without requiring the added expense of additional platinum.

FIG. 5 also shows measurement of Hc for $CoNi_7Ti_1Ta_3Pt_{12}$ plus 4 mol. % $SiO_2$ alloy (generally denoted herein as $CoNi_7Ti_1Ta_3Pt_{12}$-4% $SiO_2$) sputtered over a NiP nucleation layer as per the teachings of U.S. Pat. No. 4,786,564 (Chen et al.) and subsequently also taught in Japanese Patent Application 5-197944 (Murayama). Although the NiP nucleation layer does enhance Hc over the media sputtered without a nucleation layer, the enhancement is much lower than that observed by using the oxide doped NiP nucleation layer (NiP-2%$Al_2O_3$ and NiP-2%$TiO_2$). As will be discussed further below, FIG. 5 also shows a further enhancement in Hc by adding $N_2$ to the sputtering gas.

Figure 6:
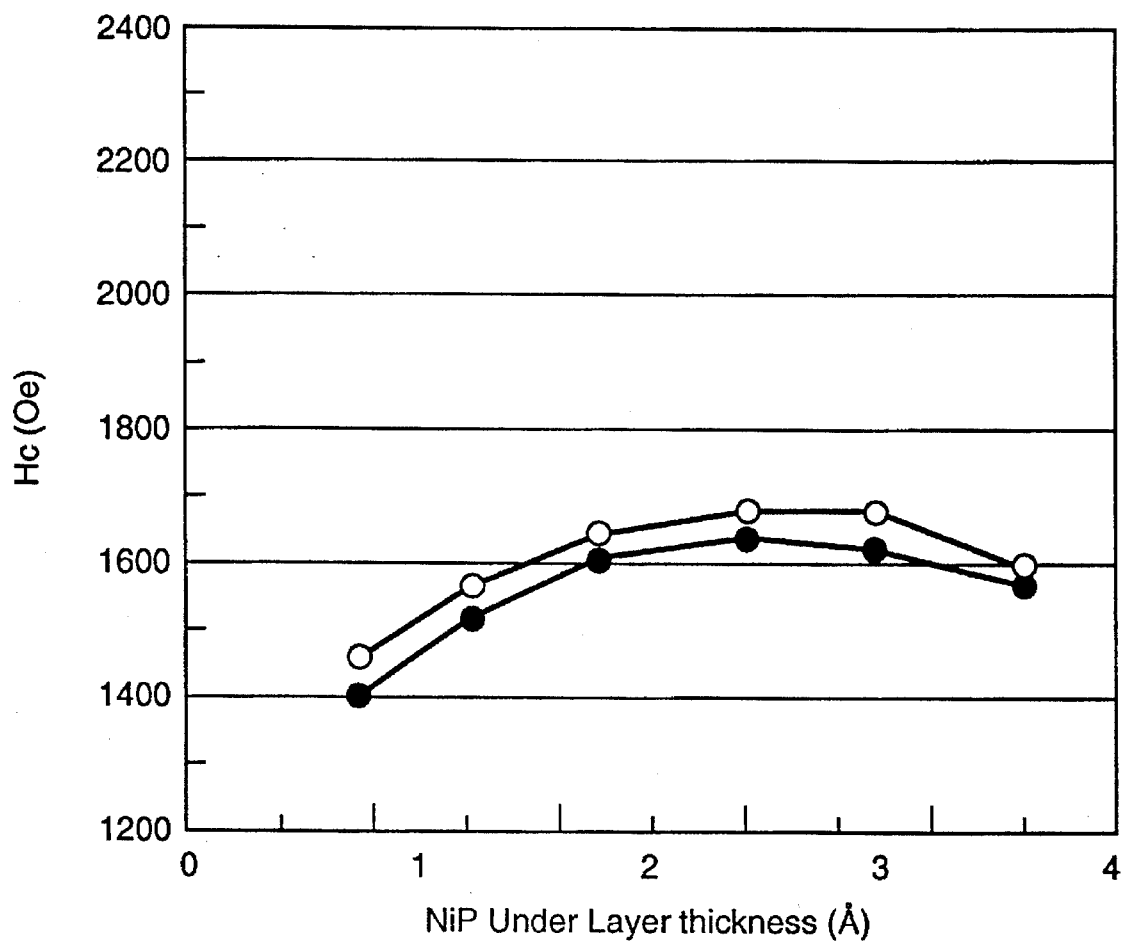
FIG. 6 shows the effect of underlayer thickness of an NiP under layer on the Hc of $CoNi_7Pt_{12}Ti_1Ta_3Pt_{12}$-4%$SiO_2$ media.

FIG. 6 shows the Hc of a $CoNi_7Ti_1Ta_3Pt_{12}$-4%$SiO_2$ media having an Mrt of 2.25 $memu/cm^2$, sputtered over an undoped NiP under layer of varying thickness and in the presence of $N_2$ in the sputtering gas. The sputtering argon pressure was 15 μm. As can be seen, although the Hc increases slightly with both increasing under layer thickness and percentage $N_2$ in the sputtering gas, the maximum Hc for this media is below 1700 Oe. This media is therefore not optimized for high density recording applications. While the Hc alone of this media could be increased, either by raising the argon pressure during sputtering or by raising the Pt content of the alloy, there are disadvantages to both of these approaches (discussed below) which offset any gains in Hc.

Figure 7:
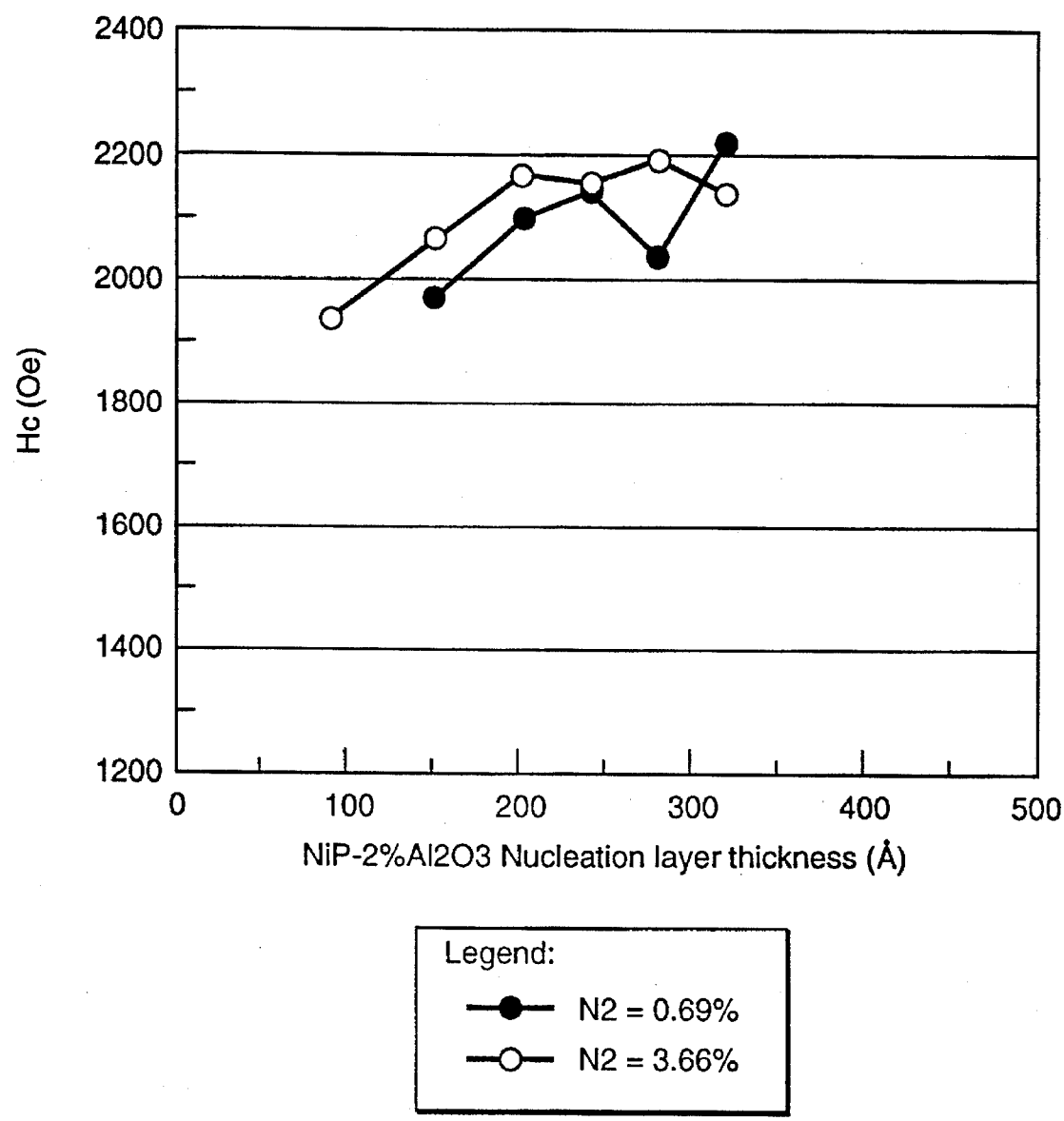
FIG. 7 shows the effect of nucleation layer thickness of an NiP-2%$Al_2O_3$ nucleation layer on the Hc of $CoNi_7Pt_{12}Ti_1Ta_3Pt_{12}$-4%$SiO_2$ media.

FIG. 7 shows the Hc of $CoNi_7Ti_1Ta_3Pt_{12}$-4%$SiO_2$ media having an Mrt of 2.25 $memu/cm^2$ which was sputtered in nearly the exact same sputtering conditions (including an argon pressure of 15 μm) as the media shown in FIGS. 5 and 6 except that a NiP-2%Al$_2$O$_3$ nucleation layer was used. As can be seen, use of the NiP-2%Al$_2$O$_3$ nucleation layer and N$_2$ in the sputtering gas yields an extremely high Hc of about 2200 Oe, even at argon pressures as low as 15 mTorr. Comparing FIGS. 6 and 7, it should be noted that the dramatic increase in Hc of 500 Oe obtained for this CoNi$_7$Ti$_1$Ta$_3$Pt$_{12}$-4%SiO$_2$ media with a nucleation layer, as compared with media formed with merely an undoped under layer, is due primarily to the proper selection of the doped nucleation layer.

Figure 8:
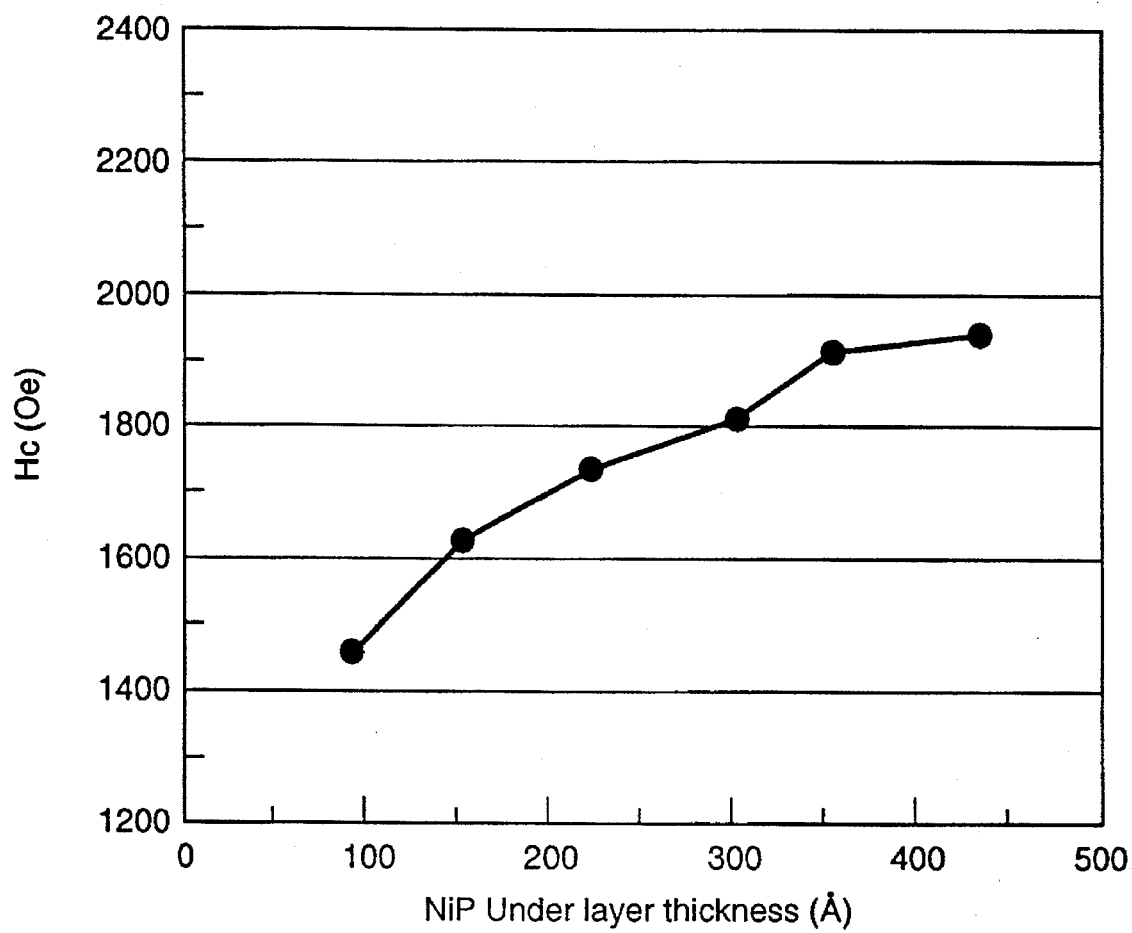
FIG. 8 shows the effect of argon sputtering pressure on the Hc of $CoNi_7Pt_{12}Ti_1Ta_3Pt_{12}$-4%$SiO_2$ media sputtered over an NiP under layer of different thickness.

FIG. 8 shows the Hc of another alloy, CoNi$_7$Ti$_{1.5}$Ta$_{1.5}$B$_2$Pt$_{12}$-2%CoO, sputtered at an argon pressure of 15 mTorr, over varying thicknesses of an undoped NiP under layer, in the presence of 1.2% N$_2$ in the sputtering gas. This media exhibited an Mrt of 2.5 memu/cm$^2$. The Hc of the media increases with increasing thickness of NiP under layer. Compared to FIG. 6, the maximum achievable These results indicate that high argon pressure can result in isolation between magnetic grains to reduce media noise as suggested by Chen et al. in the aforementioned "Physical Origin of Limits in the Performance of Thin Film Recording Media." However, as explained below, this approach of increasing the argon pressure to reduce write jitter is not desirable since OW is made worse (from a decrease in squareness). We have determined that the undoped NiP under layer does not facilitate the segregation of the insulating segregant between the magnetic grains to reduce media noise. Thus, arbitrary underlayers (such as undoped NiP) do not provide an optimized nucleation layer for subsequent magnetic grain growth. FIG. 8 and Table-I show that although an undoped NiP underlayer as taught by Murayama et al. can provide higher Hc at lower argon pressure, the write jitter noise increases dramatically at lower pressures.

TABLE I

CoNi7Ti1.5Ta1.5B2Pt12-2% CoO media over undoped NiP underlayer

| Par (mtorr) | NiP layer Thk (Å) | Hc (Oe) | Amplitude (mV) | PW50 (nS) | OW (-dB) | Write Jitter (nm) | Bit Shift (E-09, nS) |
|---|---|---|---|---|---|---|---|
| 15 | 350 | 1946 | 0.492 | 42.85 | 32.7 | 6.64 | 8.48 |
| 15 | 425 | 1938 | 0.469 | 43.58 | 32.44 | 8.08 | 9.84 |
| 25 | 300 | 1950 | 0.498 | 41.7 | 32.09 | 3.77 | 6.52 |
| 30 | 300 | 1877 | 0.506 | 41.71 | 31.7 | 2.95 | 6.18 |

Figure 9:
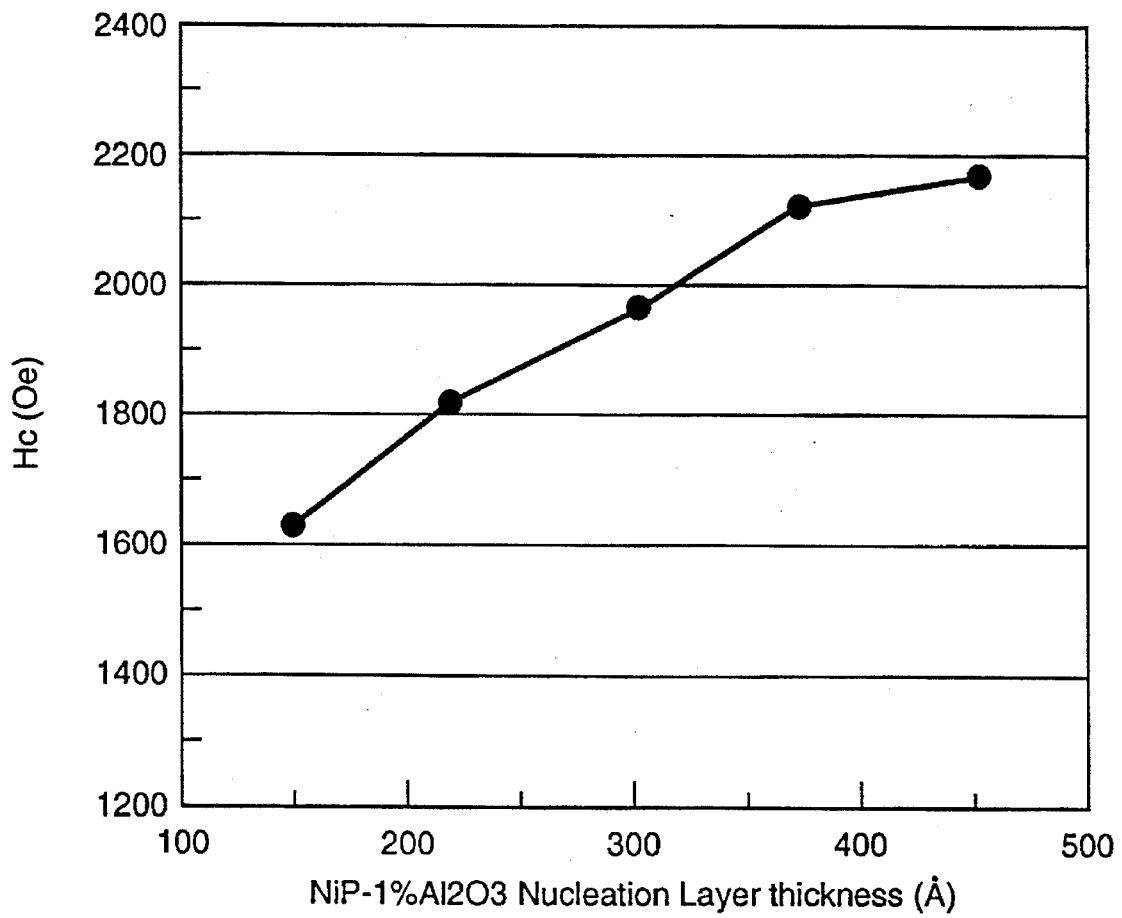
FIG. 9 shows the effect of NiP-1%$Al_2O_3$ nucleation layer thickness on the Hc of $CoNi_7Ti_{1.5}Ta_{1.5}B_2Pt_{12}$-2%CoO media.

Hc in FIG. 8 is about 200 Oe higher for identical sputtering conditions. We believe that this may be due to the difference in the magnetic alloys. In any case, as shown below, although the undoped NiP under layer provides an improvement in Hc shown in FIG. 8, the media noise of the alloy severely increases for thicker underlayer thickness. In stark contrast to FIG. 8, FIG. 9 shows the Hc of the same CoNi$_7$Ti$_{1.5}$Ta$_{1.5}$B$_2$Pt$_{12}$-2%CoO alloy having an Mrt of 2.5 memu/cm$^2$, sputtered at an argon pressure of 20 mTorr, over varying thickness of an NiP-1%Al$_2$O$_3$ nucleation layer, in the presence of 1.2% N$_2$ in the sputtering gas. It is seen once again that a higher Hc is obtained when a doped NiP nucleation layer is used.

Table-I shows the recording results of the CoNi$_7$Ti$_{1.5}$Ta$_{1.5}$B$_2$Pt$_{12}$-2%COO alloy, having an Mrt of 2.5 memu/cm$^2$, sputtered at different argon pressures over an undoped NiP underlayer layer, per Japanese Patent Application 5-197944 (Murayama et al.) In each case, the media had an overcoat of 150 Å thick hydrogenated carbon. Recording measurements were made on a Guzik-501 tester (manufactured by Guzik Corp., Santa Clara, Calif.) using a thin film inductive head having p1/g/p2 of 3.2/0.3/3.2 μm, track width of 6.0 μm and having 42 turns. The recording measurement was made at 0.873" radius at a linear velocity of 494 inches-per-second at a recording density of 60 kilo flux changes-per-inch. The nominal flying height was about 2.4 μ-inch.

Table-I shows that the CoNi$_7$Ti$_{1.5}$Ta$_{1.5}$B$_2$Pt$_{12}$-2%CoO alloy, having an Mrt of 2.5 memu/cm$^2$, sputtered at 15 mTorr over a thicker undoped NiP under layer exhibits extremely high write jitter which results in very poor bit-shift. Table-I also shows that even if the argon pressure during sputtering of these films is increased to 25 to 30 mTorr, and the write jitter and bit-shift improve substantially, the OW gets worse.

Table-II shows recording results for the same CoNi$_7$Ti$_{1.5}$Ta$_{1.5}$B$_2$Pt$_{12}$-2%CoO alloy sputtered at lower argon pressure in the presence of 1.4% N$_2$ in the sputtering gas and over a NiP-Al$_2$O$_3$ nucleation layer of thickness about 330 Å in which the percent of Al$_2$O$_3$ was varied. Recording measurement was carried out on a Gnzik-1001 tester having an air bearing spindle (manufactured by Guzik Corp., Santa Clara, Calif.) using a thin film inductive head having p1/g/p2 of 3.2/0.3/3.2 μm, track width of 6.0 μm and having 42 turns. The recording measurement was made at 0.873" radius at a linear velocity of 494 inches-per-second and at a recording density of 60 kilo flux changes-per-inch. The nominal flying height was about 2.4 μ-inch.

Table-II shows two sets of media having nearly identical Hc. On comparing the media sputtered at an argon pressure of 23 mTorr using a NiP-1%Al$_2$O$_3$ nucleation layer with media sputtered at an argon pressure of 18 mTorr using a NiP-3%Al$_2$O$_3$ nucleation layer, the latter shows better OW and better PW50 while having nearly identical write jitter and slightly better bit-shift. On comparing media sputtered at 18 mTorr using a NiP-2%Al$_2$O$_3$ nucleation layer with media sputtered at 15 mTorr using a NiP-3%Al$_2$O$_3$, the latter shows better OW and better PW50 while simultaneously maintaining lower write jitter and lower bit-shift. Comparing these results to those shown in Table-I, use of a nucleation layer with a dopant provides media having very low write jitter noise, even at very low argon pressure. As explained earlier, this is because the selected nucleation layer defines the growth of the subsequent magnetic layer and forms large angle grain boundaries allowing the segregant to uniformly segregate at those grain boundaries. This results in a complete elimination of the intergranular exchange and thereby results in a extremely low write jitter noise.

TABLE II

CoNi7Ti1.5Ta1.5B2Pt12-2% CoO sputtered using the preffered Nucleation layer

| Par (mtorr) | Nucl. Layer | Hc (Oe) | Amplitude (mVp-p) | PW50 (nS) | W Jitter (nm) | OW (−dB) | Bit Shift (e-9, nS) |
|---|---|---|---|---|---|---|---|
| 18 | NiP-3% Al2O3 | 1994 | 0.472 | 36.7 | 2.89 | 34.92 | 6.01 |
| 23 | NiP-1% Al2O3 | 1920 | 0.4989 | 37.3 | 2.8 | 34.62 | 6.08 |
| 15 | NiP-3% Al2O3 | 1852 | 0.474 | 37.23 | 3.16 | 35.49 | 6.29 |
| 18 | NiP-2% Al2O3 | 1811 | 0.5147 | 37.52 | 3.51 | 35.4 | 6.37 |

Figure 10:
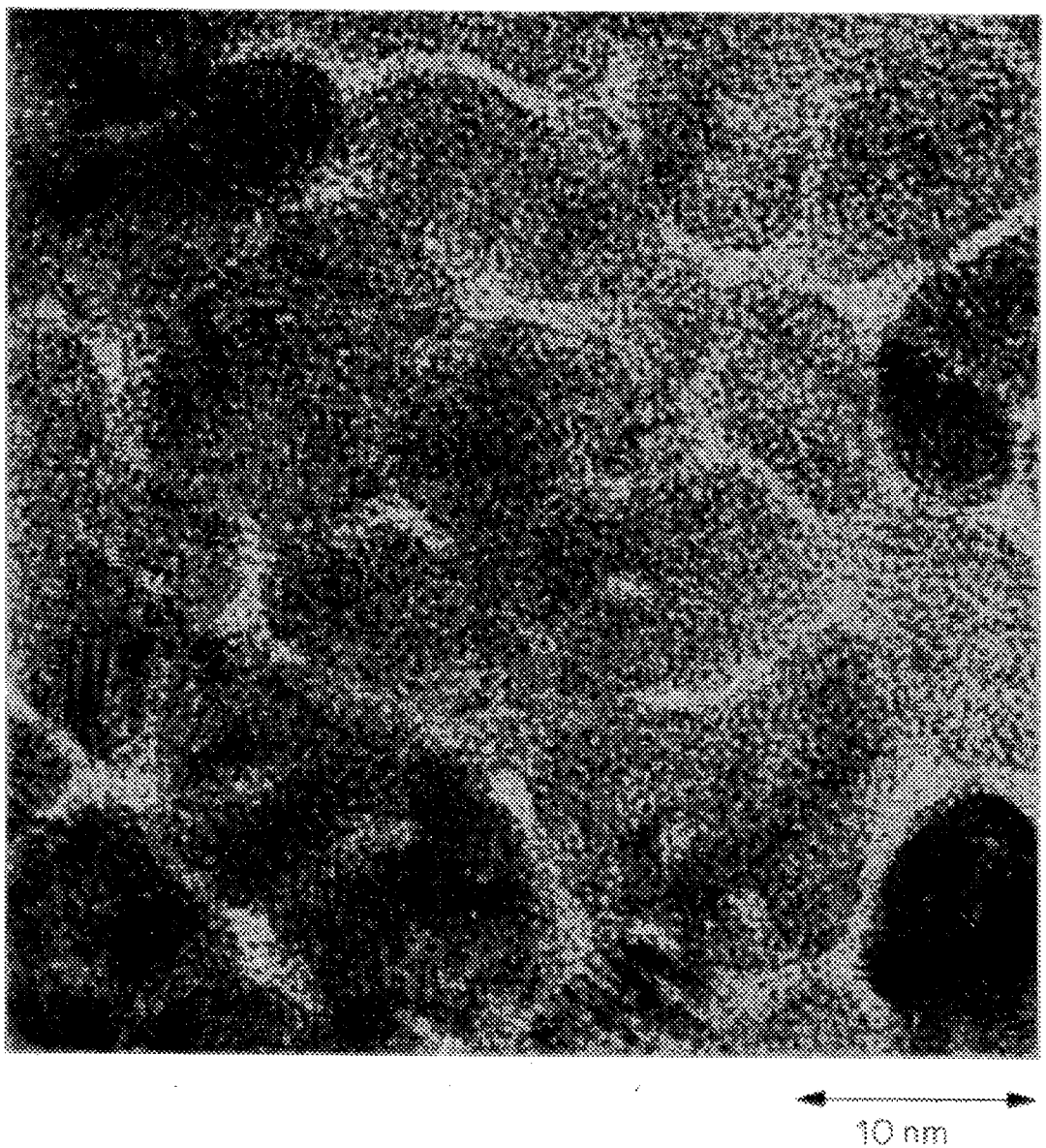
FIG. 10 shows the high resolution Transmission Electron Microscopy (TEM) micrographs of $CoCr_{11}Pt_{11}$-4%$SiO_2$ media sputtered over a NiP under layer.
Figure 11:
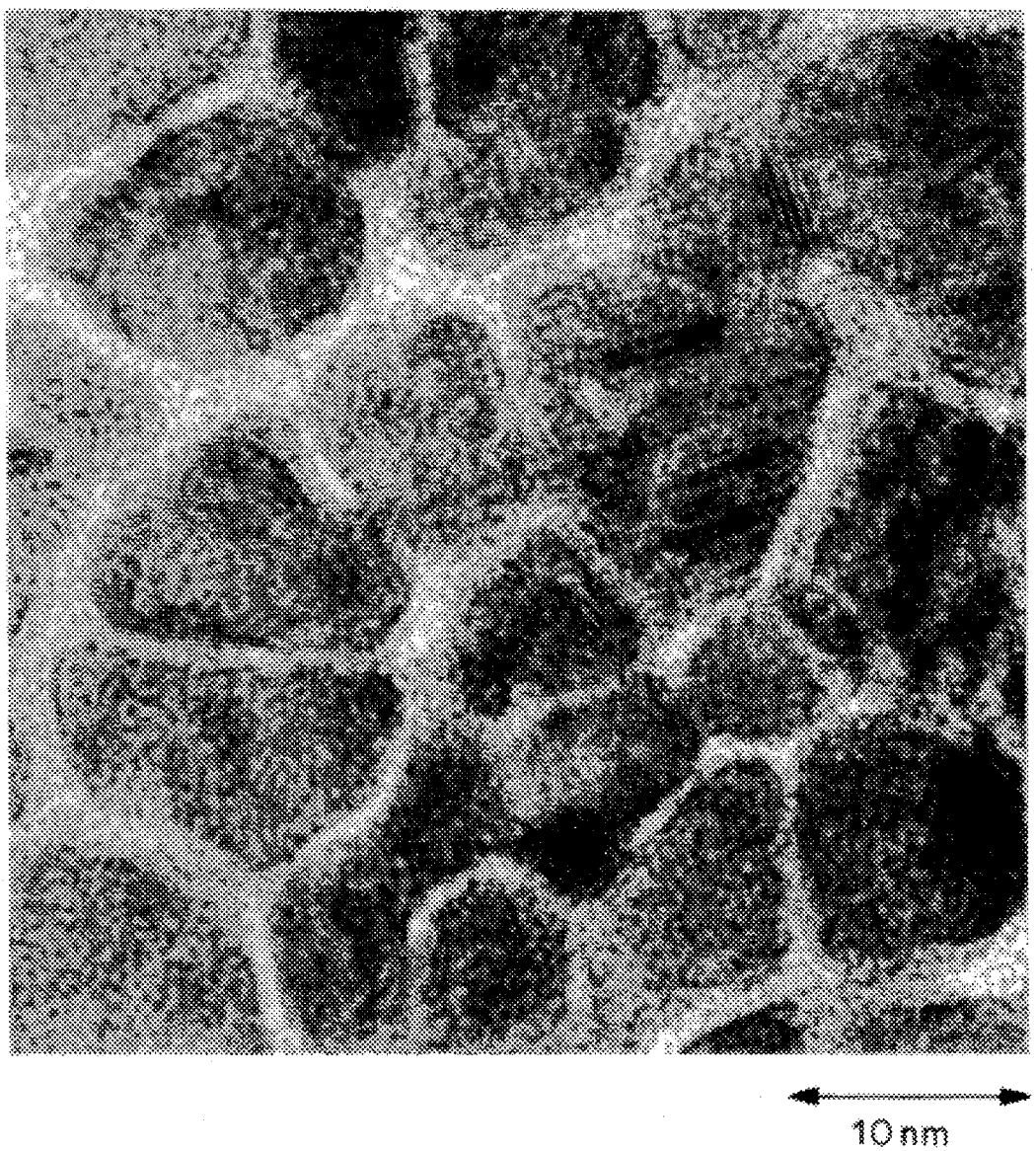
FIG. 11 shows high resolution Transmission Electron Microscopy (TEM) micrographs of $CoCr_{11}Pt_{11}$-4%$SiO_2$ media sputtered over a NiP-2%$Al_2O_3$ nucleation layer.

FIGS. 10 and 11 show high resolution TEM micrographs of $CoCr_{11}Pt_{11}$-4%$SiO_2$ media sputtered using NiP and NiP-2%$Al_2O_3$ nucleation layers, respectively. The $CoCr_{11}Pt_{11}$-4%$SiO_2$ film on undoped NiP shown in FIG. 10 was sputtered at an argon pressure of 20 mTorr in the presence of a partial pressure of $H_2O$ of $1.2\times10^{-06}$ Torr and 0.6% $N_2$ over a 300 Å thick NiP under layer. The $CoCr_{11}Pt_{11}$-4%$SiO_2$ film on NiP-2%$Al_2O_3$ shown in FIG. 11 was sputtered at an argon pressure of 15 mTorr in the presence of a partial pressure of $H_2O$ of $1.2\times10^{-06}$ Torr and 0.9% $N_2$ over a 300 Å thick NiP-2%$Al_2O_3$ nucleation layer. Although there is a slight difference in the argon pressure and % $N_2$ in gas, this is expected to have essentially no effect on the microstructure of the film.

FIG. 10 shows that the grains appear to be isolated in some areas but most grains are connected to neighboring grains which makes the isolation channel between grains very nonuniform and discontinuous. Thus, the grains of this media are at least partly exchange coupled, which causes the Hc to drop and media jitter noise to increase. This explains why a lower coercivity was obtained by Shimizu et al. (in the aforementioned "CoPtCr Composite Magnetic Thin Films" and European Patent Application 0 531 035 A1 and Japanese Patent Application 5-73880,, even at the relatively high 18% platinum content.

In contrast, FIG. 11 shows that the grains are uniformly isolated by an approximately 10 Å thick channel, which is sufficient to completely break intergranular exchange interaction and thereby provide a lower write jitter and higher Hc, as expected from the theoretical works of Zhu et al. described in the aforementioned "Micromagnetic Studies of Thin Metallic Films." Moreover, due to the uniform isolation channel and uniform grain size, the magnetostatic interaction between the grains is uniform, thereby providing higher squareness. FIGS. 10 and 11 clearly demonstrate that a NiP-$Al_2O_3$ nucleation layer facilitates the uniform segregation of the segregant to provide very low write jitter while simultaneously achieving high Hc and maintaining high squareness.

FIGS. 10 and 11 also clearly show that the presence of $SiO_2$ in the admixed form of the magnetic alloy as per the Japanese Patent Application 573880 (Shimizu et al.) is not a sufficient condition to ensure the lowest write jitter noise. In fact, the published work by Shimizu et al. entitled "CoPtCr Composite Magnetic Thin Films" shows TEM micrographs of unmixed $CoPt_{18}Cr_{12}$ and composite $CoPt_{18}Cr_{12}$-$SiO_2$ films. This reference states that "the grain boundaries are not clear in either film, indicating a very fine structure. Energy-dispersive x-ray analysis (EDX) revealed that Si atoms are uniformly distributed all over the composite films without showing any noticeable segregations at grain boundary."

We believe that the reduction in media noise in Shimizu et al.'s CoCrPt-$SiO_2$ admixture arises primarily from the reduction in grain size, i.e., a reduction in grain noise. This shows that per the approach taught by Shimizu et al. (i.e., without a nucleation layer) one cannot achieve complete isolation between the magnetic grains. As stated earlier, the intergranular exchange induced noise has to be completely eliminated to obtain the lowest possible noise. As we have found, this can only happen if a proper nucleation layer (such as NiP with dopant) is used to facilitate the segregation of the insulating segregant. FIG. 11 shows that a magnetic alloy including $SiO_2$ which is formed on a NiP nucleation layer without a dopant, as taught by Japanese Patent Application 5- 197944 (Murayama et al.) is also not a sufficient condition to completely suppress the intergranular exchange coupling and provide the lowest media noise.

We have found that in order to get the lowest media noise and very high squareness, the magnetic recording layer should not only include the insoluble segregant compound formed on a proper nucleation layer, but should be sputtered under the proper sputtering conditions of low argon sputtering pressure and low partial pressure of $H_2O$. In the following, we discuss the rationale behind using such process conditions.

Figure 12A:
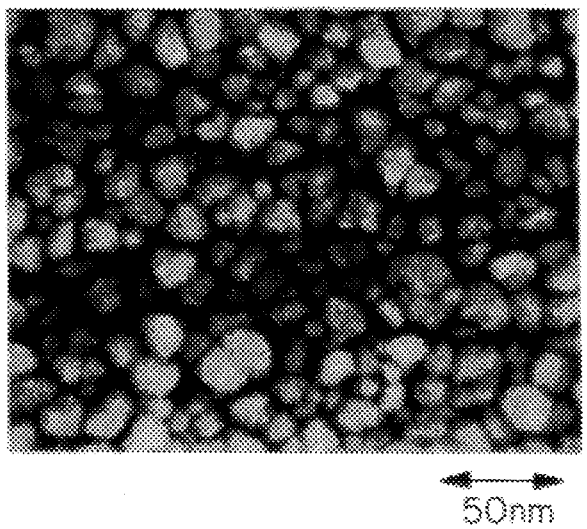
FIG. 12 shows high resolution SEM micrographs of $CoNi_9Pt_{10}$ media sputtered over an NiP-0.5%$Al_2O_3$ nucleation layer at different partial pressures of $H_2O$ during deposition.
Figure 12B:
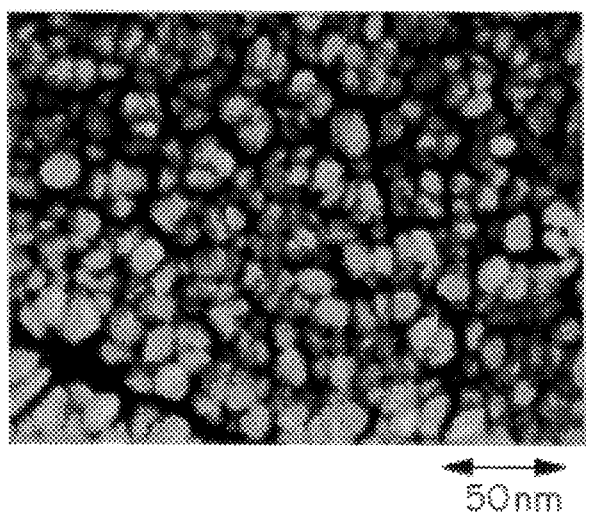
Figure 12C:
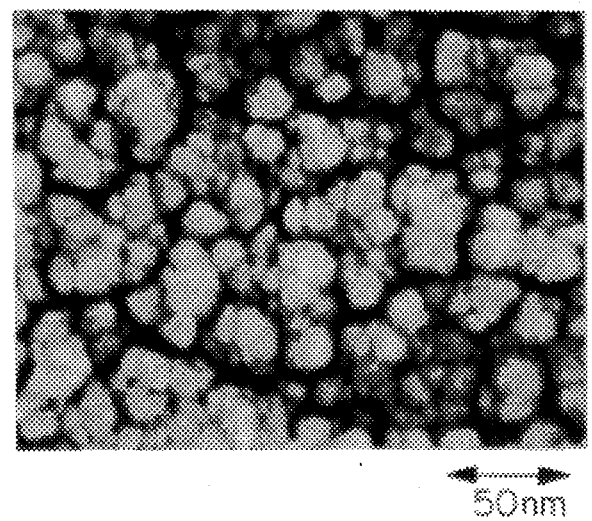

FIG. 12 shows high resolution Scanning Electron Micrographs (SEMs) obtained from an Hitachi Scanning Electron Microscope of a $CoNi_9Pt_{10}$ film which was sputtered at an argon pressure of 30 mTorr over a 50 nm thick undoped sputtered NiP underlayer under different partial pressures of $H_2O$. Shown at 12a is an SEM for a media sputtered with a partial pressure of $H_2O$ of $2.8\times10^{-07}$ Torr, 12b is an SEM for a media sputtered with a partial pressure of $H_2O$ of $1.1\times10^{-06}$ Torr, and 12c is an SEM for a media sputtered with a partial pressure of $H_2O$ of $1.1\times10^{-05}$ Torr.

As can be seen at 12a and 12b, the grains of the magnetic films sputtered at lower partial pressures of $H_2O$ consists mostly of single crystallite grains. However, at 12c there is shown a number of smaller crystallites clustering together to form grains. The sizes and shapes of these clustered grains change from one area to another. On the one hand, for the $CoNi_9Pt_{10}$ film sputtered in presence of low partial pressure of $H_2O$ (12a and 12b), the individual grains are almost entirely single crystals of $CoNi_9Pt_{10}$. On the other hand, film 12c shows areas that contain a number of single crystallites which seem to be intimately connected to each other which are therefore likely highly exchange coupled within the clustered grain. During magnetization reversal, the clustered grain of different sizes reverse at different magnetic fields, which results in a broad switching field distribution and thereby lower squareness. Thus, a lower partial pressure of $H_2O$ during sputtering results in very uniform switching during magnetization reversal to provide sharper switching field distribution and thereby higher S*.

Figure 13:
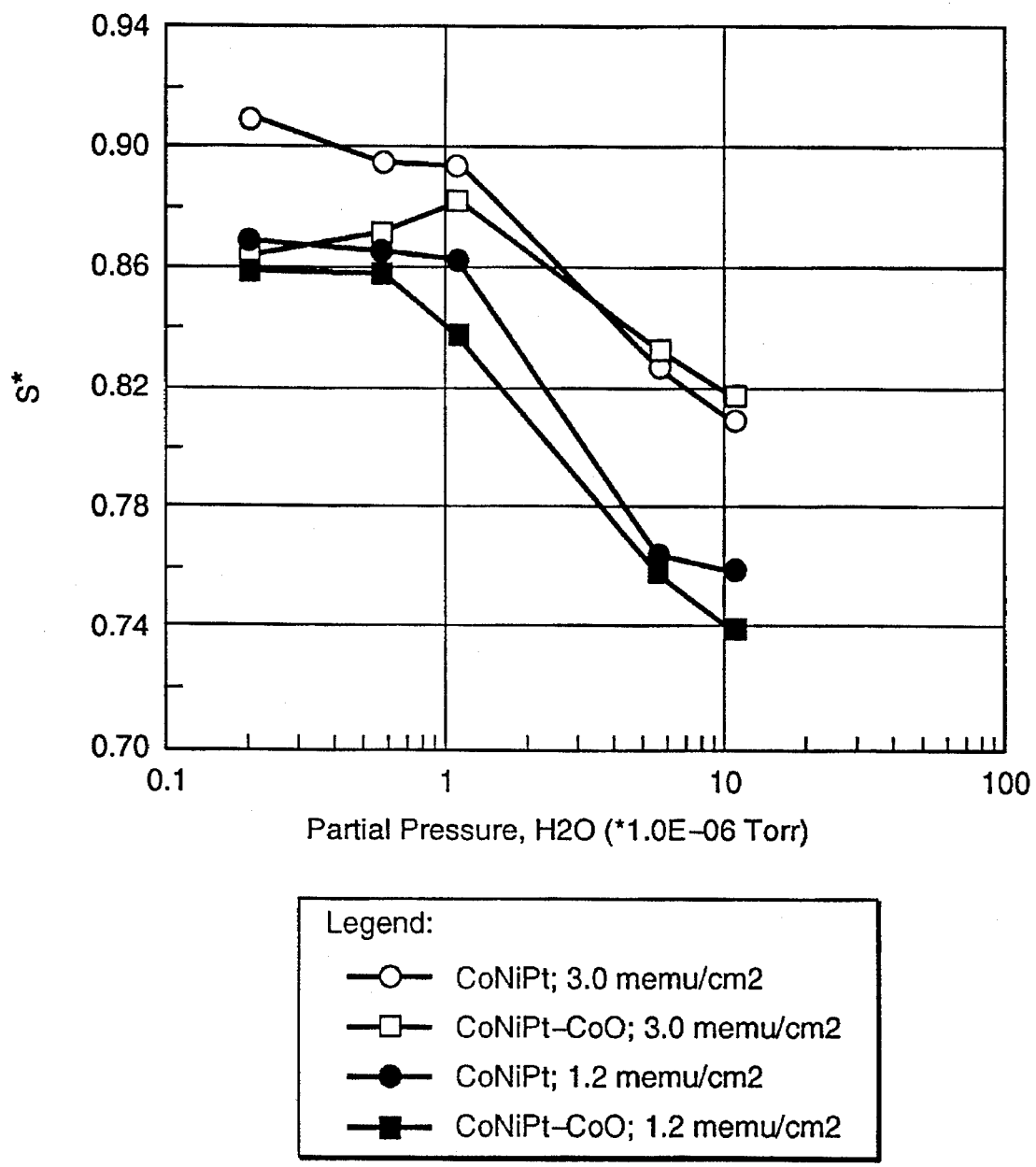
FIG. 13 shows S* of $CoNi_9Pt_{10}$ and $CoNi_9Pt_{10}$-CoO media of different Mrt sputtered at different partial pressures of $H_2O$ during deposition.

FIG. 13 shows a plot of coercivity squareness S* as a function of the partial pressure of $H_2O$ in the sputtering gas for the magnetic alloys $CoNi_9Pt_{10}$ and $CoNi_9Pt_{10}$-2%CoO formed on a 300 Å thick nucleation layer of sputtered NiP (containing 15.5 wt. % P) doped with about 0.5 wt. % $Al_2O_3$. The argon pressure during sputtering of both the nucleation layer and the magnetic layers was kept at 30 mTorr. FIG. 13 shows data for two sets of media, one having an Mrt of about 3.0 memu/cm², as suited for recording applications using an inductive head, and the other of media having a lower Mrt of about 1.2 memu/cm², as suited for recording applications using magneto-resistive heads. As can be seen, the S* for each of the media drops as the partial pressure of $H_2O$ during sputtering is increased. As mentioned earlier, for future high recording density applications, the preferred media for inductive head applications should have an S* of at least 0.85 and the preferred media for MR head applications should have an S* of at least 0.8. Therefore, we have found that the partial pressure of $H_2O$ during sputtering should be kept at least below $5 \times 10^{-06}$ Torr.

Figure 14A:
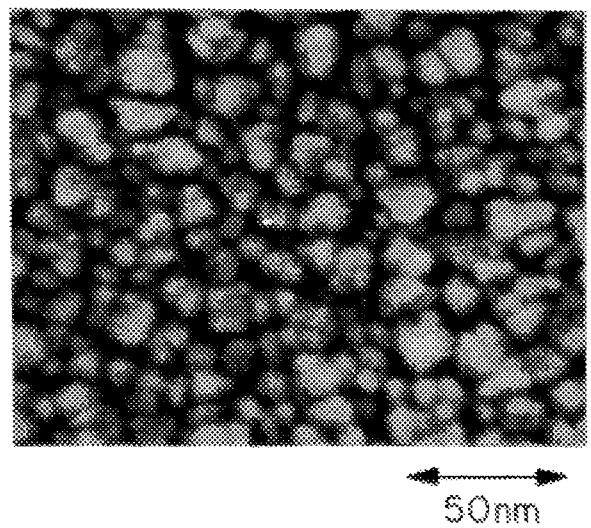
FIG. 14 shows high resolution SEM micrographs of $CoNi_7Ti_{1.5}Ta_{1.5}B_2Pt_{12}$-2%CoO media sputtered under different argon pressure conditions.
Figure 14B:
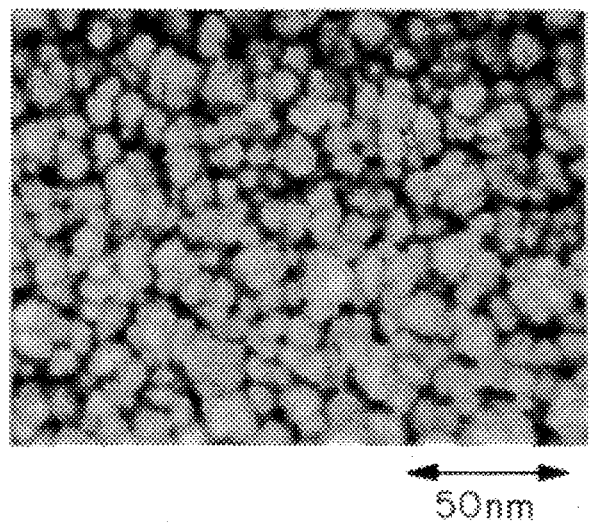
Figure 14C:
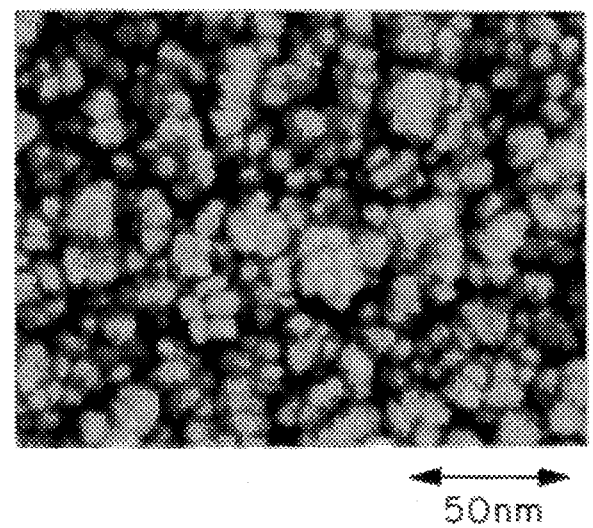

FIG. 14 shows the effects of varying argon sputtering pressure during the deposition of a $CoNi_7Ti_{1.5}Ta_{1.5}B_2Pt_{12}$-2%CoO alloy over a 300 Å thick nucleation layer of NiP (15.5 wt. % P) doped with 1% $Al_2O_3$. The recording layer was about 45 nm thick and the partial pressure of $H_2O$ was about $2 \times 10^{-06}$ Torr. Shown at 14a is a recording layer sputtered at an argon pressure of 20 mTorr. The gains shown at 14a are mostly single crystallites of uniform size which are very uniformly distributed. Shown at 14b is a recording layer sputtered at an argon pressure of 25 mTorr. Here, smaller crystallites begin to cluster together to form grains. Shown at 14c is a recording layer sputtered at an argon pressure of 30 mTorr. Here, the magnetic film clearly contains a large numbers of clustered grains of different size, i.e., having highly nonuniform grain size and distribution. As mentioned earlier, the magnetic film sputtered at 30 mTorr is expected to have broader switching field distribution and lower squareness. Thus, as the argon pressure during sputtering is increased, the grain structure changes from most uniform grain size and distribution to a highly nonuniform grain size and distribution.

Table-III shows magnetic and recording properties of a $CoNi_7Ti_{1.5}Ta_{1.5}B_2Pt_{12}$-2% CoO alloy which were sputtered under different sputtering pressures of argon over different nucleation layers, with an hydrogenated carbon overcoat of 200 Å. The recording properties were measured on a Guzik-501 tester using a thin film inductive head having p1/g/p2 of 3.2/0.3/3.2 µm, a track width of 6.0 µm, and 42 turns. The nominal flying height was about 3.0 µ-inches at 494 inches-per-second, and at a recording density of 60 kilo flux changes-per-inch. Note that during the measurement a fixed disk was used as a standard "reference" media. The recording results shown in Table-III are either normalized ratios or differences from the values obtained for the reference disk. For example, the OW and bit-shift values are the differences between the measured values and the reference values, and a higher negative value indicates better bit-shift performance while a higher positive number for OW indicates improvement. Similarly, write jitter is a ratio, and a number smaller than one indicates improvement. Thus, for the reference sample the relative OW value is 0, bit-shift is 0 and write jitter is 1.0.

As can be seen, when the argon pressure was decreased from 30 mTorr to 20 mTorr, the OW and PW50 improved, while the write jitter and bit-shift worsened. Comparing the S* and SFD, as the argon sputtering pressure drops, the S* increase and SFD decreases. Thus, although a lower argon pressure is more desirable due to higher squareness, the application of this practice in this case is limited by write jitter and bit-shift. Note that in this case, as compared to Table-II, a nucleation layer is used having only 1% $Al_2O_3$ as a dopant, and the magnetic layer has only 2 mol. % of segregant. As shown in Table-II and below, if a larger amount of dopant is used in the nucleation layer and if a larger amount of segregant is incorporated into the magnetic recording layer, lower argon sputtering pressures (e.g., below 20 mTorr) can be used to achieve high squareness and lower SFD while maintaining very low write jitter noise.

TABLE III $CoNi_7Ti_{1.5}Ta_{1.5}B_2Pt_{12}$-2% CoO sputtered using the different Nucleation layers

| Par (mtorr) | Nucl./Under Layer | Hc (Oe) | S* | SFD | PW50 (ratio) | W Jitter (ratio) | OW (−dB, diff.) | Bit Shift (E-9, diff.) |
| --- | --- | --- | --- | --- | --- | --- | --- | --- |
| 30 | NiP-1% Al2O3 | 1899 | 0.868 | 0.161 | 0.98 | 0.742 | −0.38 | −0.66 |
| 25 | NiP-1% Al2O3 | 1863 | 0.899 | 0.124 | 0.96 | 0.84 | −0.05 | −0.76 |
| 20 | NiP-1% Al2O3 | 1857 | 0.907 | 0.12 | 0.96 | 0.989 | 0.41 | −0.48 |
| 15 | NiP | 1900 | | | 1.01 | 0.985 | 1.54 | 1.95 |

**Reference media was a CoNiCrPt media having coercivity of 1920 Oe and Mrt of 2.38 memu/cm2; 200Å hydrogenated carbon overcoat; sputtered at argon pressure of 30 mtorr using a NIP nucleation layer We have also found that addition of small amount of a contributant gas, such as $N_2$, during the sputtering of the magnetic recording layer results in further reduction of write jitter noise and generally an enhancement in squareness. As shown below, we have found that introduction of small amount of $N_2$ during sputtering of magnetic recording layer in accordance with the present invention helps further improve the write jitter without negatively affecting PW50 or OW. This is believed to be arising from the reduction in the grain noise and further reduction of exchange induced noise. Thus, we believe that a certain amount of the contributant gas is segregated at the magnetic grain boundaries and further insulates the individual grains from one another. We have also found that in the thicker magnetic films, such as those having an Mrt of about 2.5 memu/cm² for inductive head applications, the easy axis (c-axis) of magnetization of the crystals tend to grow out of the plane when the partial pressure of $H_2O$ is very low, such as below $1.2 \times 10^{-06}$ Torr. The addition of the contributant gas aids in bringing the easy axis back into the plane of the recording media. This out of plane growth has not been a serious problem, however, for thinner magnetic films such as those having an Mrt of about 1.0 memu/cm² for magneto resistive head applications. In the following we have described the effects of $N_2$ addition.

Figure 15:
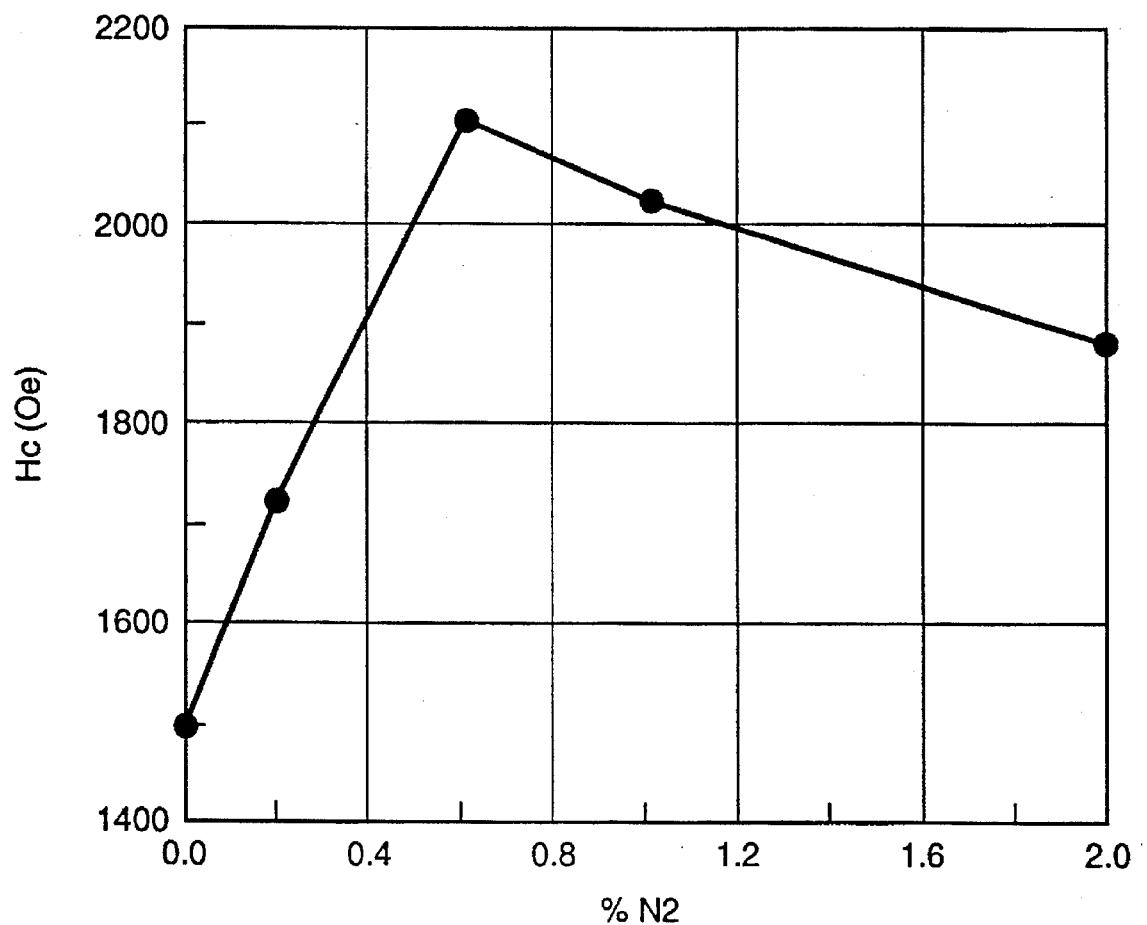
FIGS. 15–17 show the effects of varying the percent nitrogen addition during sputtering on the magnetic properties Hc, S*, and SFD, respectively, of $CoNi_7Ti_{1.5}Ta_{1.5}B_2Pt_{12}$-2%CoO media.
Figure 16:
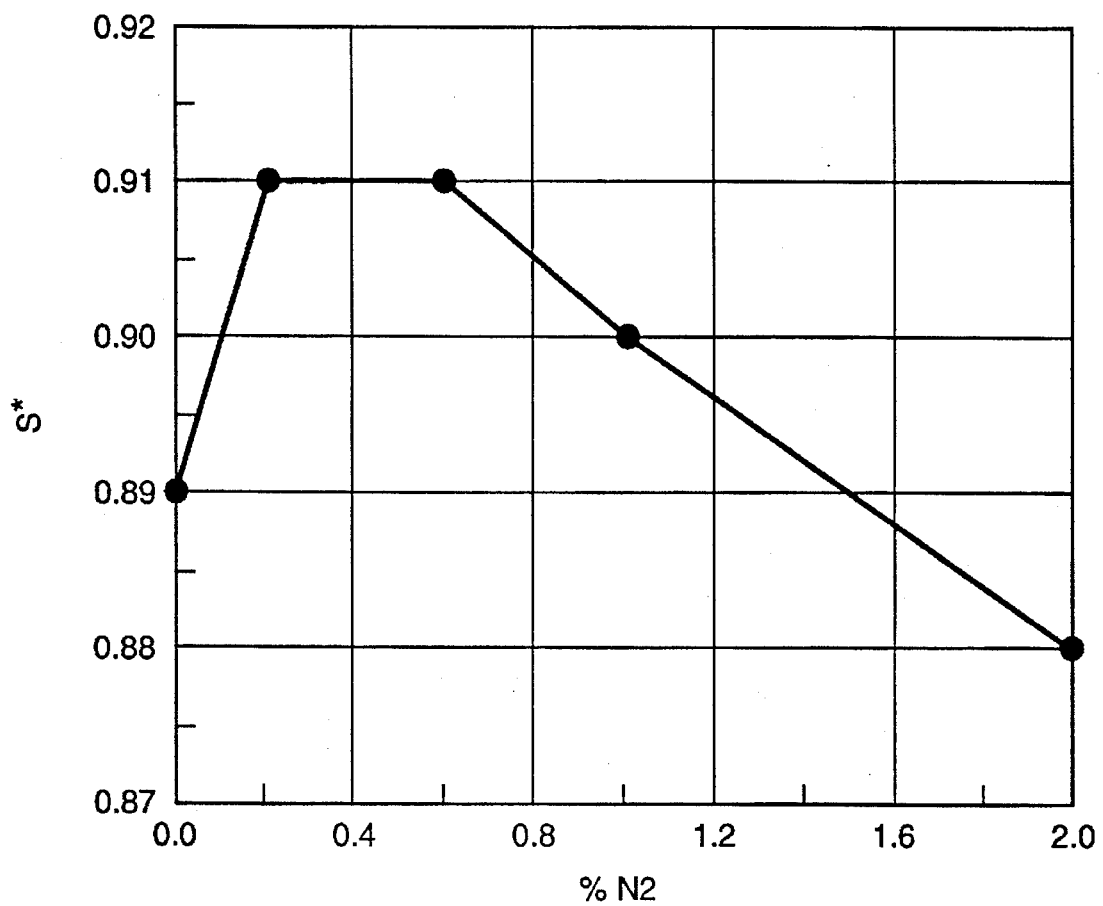
Figure 17:
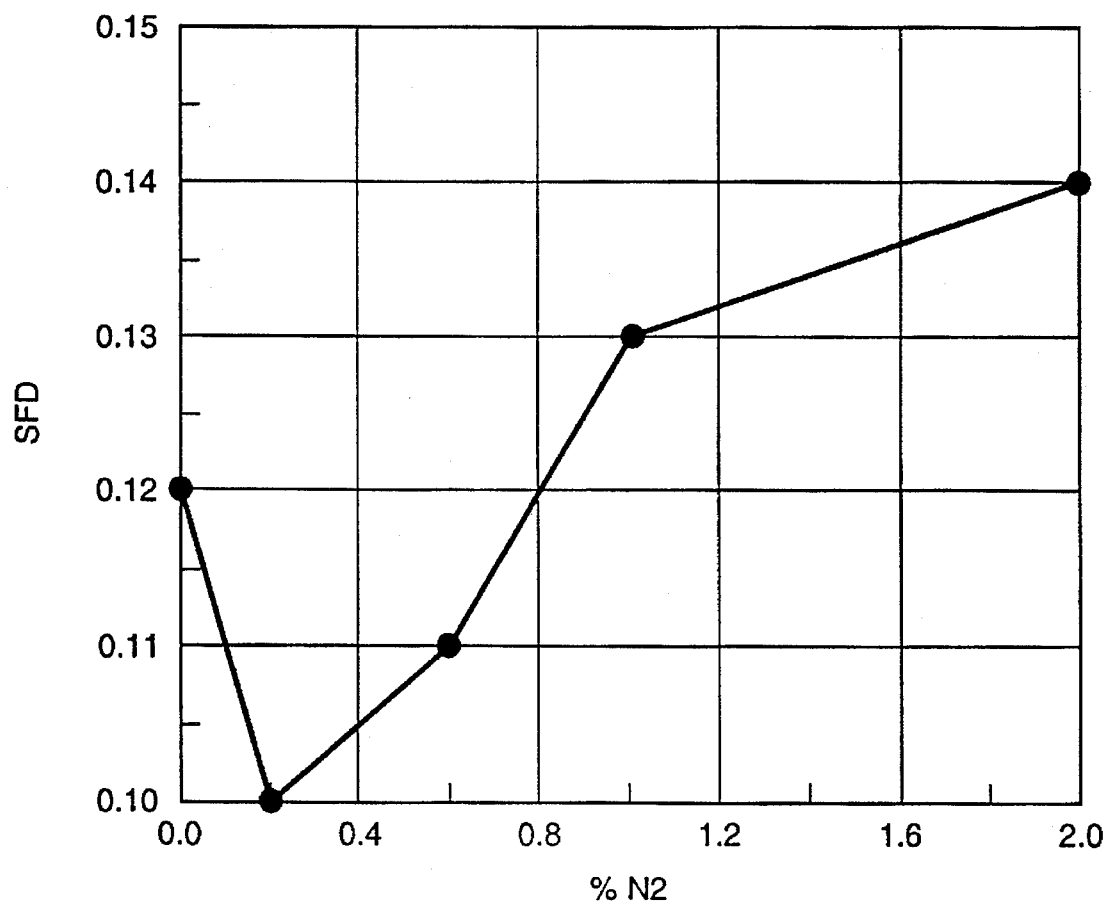

FIGS. 15-17 show Hc, S* and SFD, respectively, as a function of varying $N_2$ concentrations for a $CoNi_7Ti_{1.5}Ta_{1.5}B_2Pt_{12}$-CoO alloy having an Mrt of about 2.5 memu/cm² and sputtered in a RF diode sputtering system over a 300 Å thick nucleation layer of NiP-2%$Al_2O_3$ with a constant partial pressure of water of $2.0 \times 10^{-07}$ Torr, and a constant argon pressure of 20 mTorr. As can be seen from FIG. 15, the He of the magnetic recording layer increased up to a $N_2$ concentration of about 0.5%. FIG. 16 shows that the S* of the magnetic medium is also improved by introducing this small amount of $N_2$ during sputtering. Finally, FIG. 17 shows that the SFD of the medium also drops by introducing a small mount of $N_2$ gas during sputtering, although the effect peaks at approximately 0.2%.

The results of our extensive research on various magnetic alloys have shown that although the nature of the effect of the introduction of a contributant gas such as $N_2$ during sputtering on the He of the magnetic layer is different for different alloys, the squareness generally always increases with the introduction of small mounts of $N_2$, and SFD decreases if the partial pressure of $H_2O$ is maintained lower than $5 \times 10^{-06}$ Torr. We currently believe that the squareness increase with $N_2$ introduction arises due to at least two effects. First, introduction of $N_2$ gas suppresses the columnar growth of the magnetic grains. Second, introduction of $N_2$ gas forces the c-axis (the easy magnetization axis of the crystal) of the magnetic crystals to stay in the plane of the media. Both these effects increase the squareness and reduce the switching field distribution.

Figure 18:
FIGS. 18–20 show high resolution TEM micrographs of $CoNi_7Ti_{1.5}Ta_{1.5}B_2Pt_{12}$-2%CoO media sputtered under different percent nitrogen addition in the sputtering gas.
Figure 19:
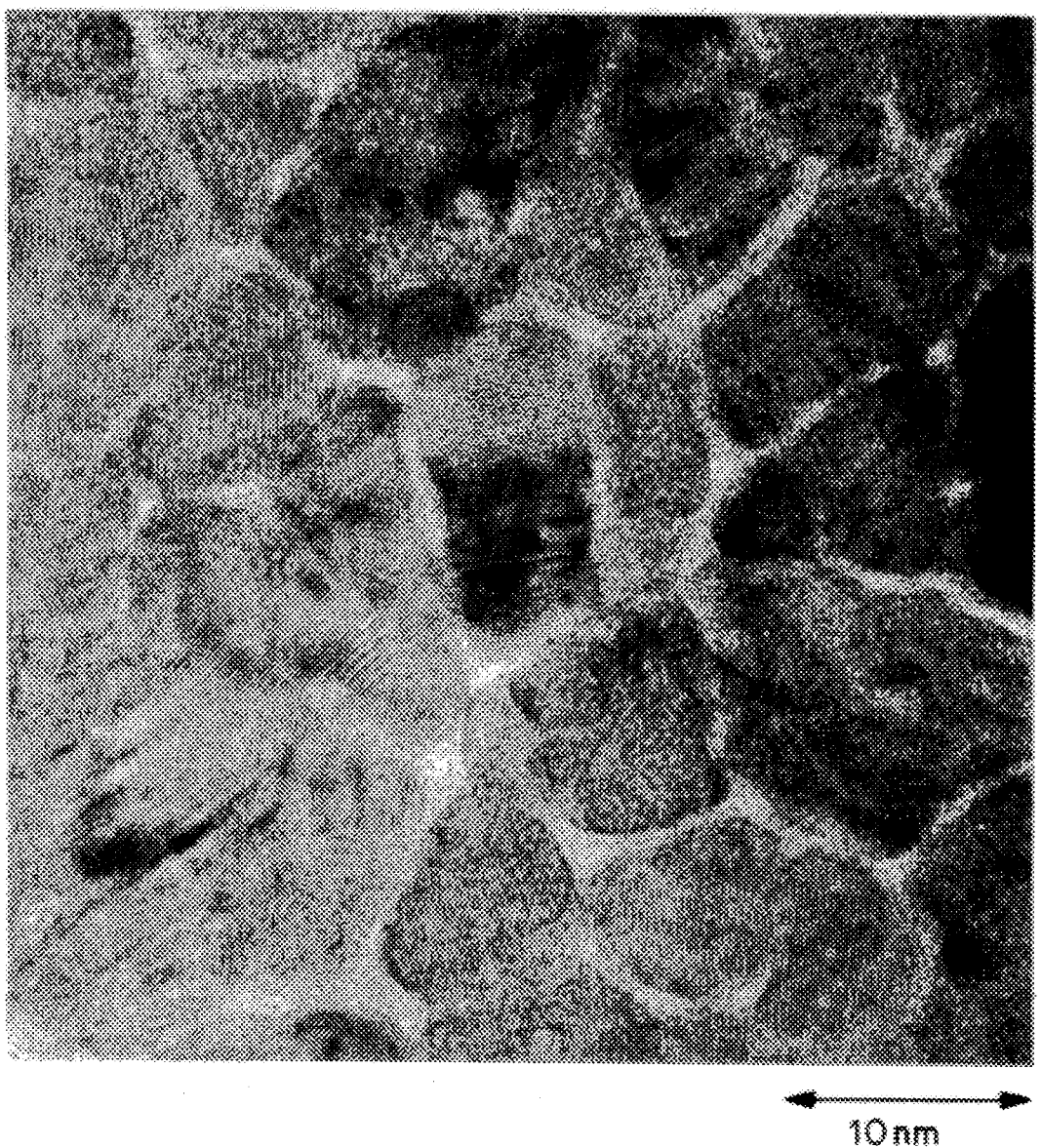
Figure 20:
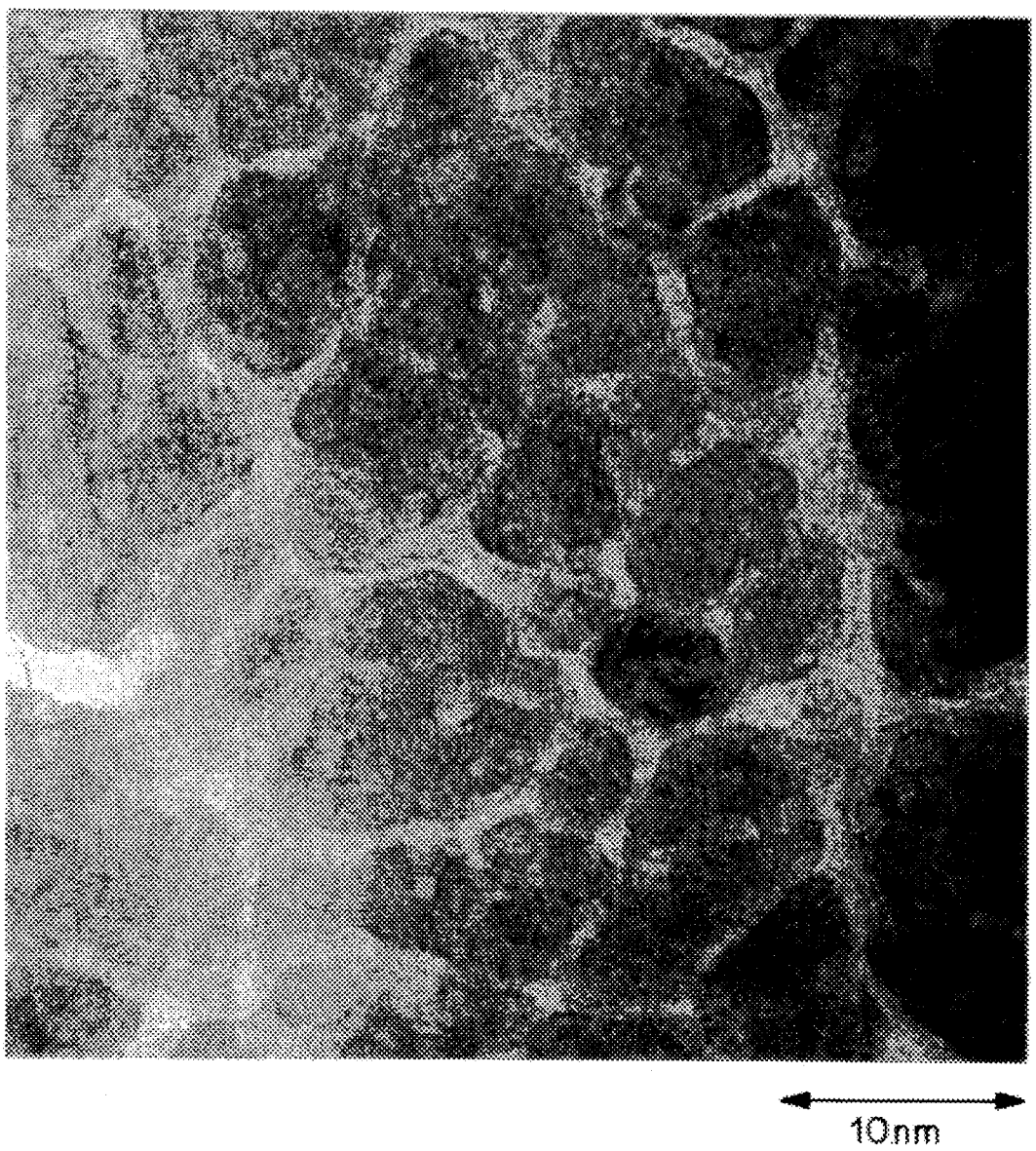

FIGS. 18–20 show plan view high resolution transmission electron microscopy (HR TEM) micrographs, obtained from a Philips EM430ST, of a $CoNi_7Ti_{1.5}Ta_{1.5}B_2Pt_{12}$-2% CoO alloy sputtered at an argon pressure of 20 mTorr on about a 300 Å thick NiP-2%$Al_2O_3$ nucleation layer under different partial pressure of water and $N_2$ conditions. FIG. 18 corresponds to media which was sputtered under a partial pressure of $H_2O$ of about $3.5 \times 10^{-07}$ Torr and 0% $N_2$ gas. FIG. 19 corresponds to a media which was sputtered at a partial pressure of $H_2O$ of about $3.5 \times 10^{-07}$ Torr and about 0.6% $N_2$ gas present in the sputtering gas. Comparing FIG. 18 to FIG. 19, the grains of the $CoNi_7Ti_{1.5}Ta_{1.5}B_2Pt_{12}$-2%CoO alloy in FIG. 18 are smaller and more completely isolated from one single crystallite grain to another. This demonstrates that the introduction of $N_2$ results in further enhancing the segregation of the segregant, which more effectively isolates the individual grains and results in a further reduction in media noise. At the same time, the grain size is further reduced, which results in a decrease in grain noise. Therefore, media is provided having a minimum total media noise.

FIG. 20 shows a film which was sputtered at a somewhat higher partial pressure of $H_2O$, specifically $1.2 \times 10^{-06}$ Torr, but in the presence of the relatively much higher $N_2$ content of 2%. As can be seen, a high concentration of $N_2$ gas also results in a relatively non-uniform grain size and non-uniform separation between grains across the film. Consequently, the magnetostatic interaction between magnetic grains will be non-uniform across the film, resulting in lower S* and higher SFD, as shown in FIGS. 16 and 17.

Clearly, there is a lower range of $N_2$ concentration which is desirable (1) to maintain the c-axis of the magnetic crystals in plane, (2) to facilitate a single crystallite grain growth, and (3) to very likely enhance the grain isolation effect by facilitating the segregation of the insoluble stable compound (COO, in this case). However, there is a limit above which the microstructure of the grains become too non-uniform and hence decrease squareness. Therefore, selection of right amount of $N_2$ for introduction during the deposition of the magnetic layer is very critical. It should be noted that although the Japanese Patent Application by Murayama et al. discusses use of $N_2$, the cited range of 0.1 to 10% is to control the Hc of the magnetic layer per the teachings of U.S. Pat. No. 4,749,459 (Yamashita et al.), and not for morphological control at taught by the present invention. As shown in FIG. 20, sputtering in the presence of high amounts of $N_2$ result in nonuniform grain growth and ultimately in poor squareness. Therefore, we believe there are other preferred ways of controlling the Hc than as taught by Murayama et al., such as increasing the Pt content of the alloy.

FIGS. 19 and 20 also show that high amounts of $N_2$ can itself be used as a segregant, but once again too high an amount of $N_2$ will result in poor squareness, broader SFD, and consequently poor PW50 and poor OW. Hence, a combination of stable insoluble segregant and smaller amounts of $N_2$ can be extremely effective in completely suppressing the intergranular exchange coupling and simultaneously maintaining very high squareness. This was clearly not recognized in the art, since Murayama et al. for example teaches the broad range of 0.1–10 vol. % $N_2$, so broad as to suggest that they failed to realize the role of $N_2$, as taught by the present invention.

Table-IV shows the process conditions, magnetic properties, and recording properties of a $CoNi_7Ti_1Ta_3Pt_{12}$ magnetic alloy having 4 mol. % of $SiO_2$ segregant sputtered as per teachings of this invention to illustrate a preferred mode of operation. For comparison, we have also included a $CoNi_7Cr_4Pt_{12}$ media sputtered at high argon pressure over a NiP nucleation layer without any dopant, and a $CoNi_7Ti_{1.5}Ta_{1.5}B_2Pt_{12}$ alloy having 2 mol. % of CoO segregant sputtered at higher argon pressure. Each disk had a 200 Å thick hydrogenated carbon overcoat. The recording measurement was carried out on a Guzik-1001 tester having an air-bearing (manufactured by Guzik Corp., Santa Clara, Calif.) using a thin film inductive head of p1/g/p2 of 3.2/0.3/3.2 µm, track width of 6.0 µm and 42 turns. The recording measurements were made at 0.873 inch radius at a linear velocity of 493.67 inches-per-second, at a recording density of 51.45 kilo-flux changes-per-inch, and at a nominal flying height of about 2.5 µ-inches.

The recording results shown in Table-IV are normalized with respect to a reference disk which was one of the best performing commercially available CoCrTa oriented media. For example, the OW and bit-shift values are the difference with the reference media and a higher negative value indicates better bit-shift performance while a higher positive number for OW indicates improvement, and write jitter is a ratio and a number smaller than one indicates improvement. Thus for the reference sample the relative OW value is 0, bit-shift is 0 and write jitter is 1.0.

Table-IV shows recording results of sample "F" which has a magnetic alloy of $CoNi_7Cr_4Pt_{12}$ (without any segregant) which was sputtered at a high argon pressure of 30 mTorr. As can be seen, this media exhibits worse PW50, worse OW and substantially worse write jitter than the reference sample. Sample "A" consists of a magnetic alloy which appears to contain sufficient segregant but which is sputtered at a higher argon pressure of 25 mTorr onto an undoped NiP underlayer. This media exhibits lower write jitter noise than the $CoNi_7Cr_4Pt_{12}$ media, in spite of slightly lower argon pressure, due to the presence of the segregant. However, the OW for this media is much worse for the reasons explained earlier. In comparison, sample "G" has lower content of segregant in the magnetic film, specifically 2%, and a smaller amount of dopant in the nucleation layer, specifically 1%$Al_2O_3$, and was sputtered at higher argon pressure, specifically 23 mTorr. The write jitter is better than that of sample "F", but not as good as that of sample "A". The OW is also better than that of samples "F" and "A" which is attributable to the oxide doped nucleation layer.

Sample "B" shows that the recording performance can be even further improved by increasing the amount of dopant in the nucleation layer, specifically up from 1% to 2% $Al_2O_3$, and lowering the argon pressure. Samples "B","C", and "D" show that the recording performance can be yet further improved by the addition of $N_2$ in the sputtering gas. Sample "E" shows that the OW of the media can be even further improved without significantly sacrificing the write jitter noise by lowering the argon pressure to 12 mTorr and slightly increasing the nucleation layer thickness to 180 Å.

Table-V shows recording performance of a $CoCr_{11}Pt_{11}$-4 mol %$SiO_2$ alloy which was sputtered at 15 mTorr under different amounts of $N_2$ in the sputtering gas during the deposition of the magnetic recording layer using different nucleation layers. These media were tested using a dual-stripe magneto-resistive head having a track width of 3.5 μm and a bias current of 11 milli-amps. It can be seen that when the percent $N_2$ present during sputtering of the $CoCr_{11}Pt_{11}$-

TABLE IV

| ID | Magnetic Alloy | Nucl./Under Layer | N./U. Thk (Å) | Par (mTorr) | N2 Gas (%) | Hc (Oe) | PW50 (ratio) | OW (diff., –dB) | W Jitter (ratio) | Bit-shift (diff., nS) |
|----|----------------|-------------------|---------------|-------------|------------|---------|--------------|-----------------|------------------|------------------------|
| A | CoNiPtTiTa-4% SiO2 | NiP-0% Dopant | 300 | 25 | 1.6 | 1895 | 0.96 | –1.46 | 0.686 | –0.6 |
| B | CoNiPtTiTa-4% SiO2 | NiP-2% Al2O3 | 170 | 15 | 0 | 1906 | 0.98 | –0.62 | 0.884 | –0.45 |
| C | CoNiPtTiTa-4% SiO2 | NiP-2% Al2O3 | 170 | 15 | 0.34 | 1975 | 0.97 | –0.58 | 0.825 | –0.57 |
| D | CoNiPtTiTa-4% SiO2 | NiP-2% Al2O3 | 150 | 15 | 0.69 | 1947 | 0.97 | –0.28 | 0.835 | –0.51 |
| E | CoNiPtTiTa-4% SiO2 | NiP-2% Al2O3 | 180 | 12 | 0.69 | 1932 | 0.97 | 0.29 | 0.871 | –0.36 |
| F | CoNiCrPt12 | NiP-0% Dopant | 300 | 30 | 0.69 | 1920 | 1.01 | –0.56 | 1.169 | 0.2 |
| G | CoNiTiTaBPt-2% CoO | NiP-1% Al2O3 | 300 | 23 | 0.69 | 1920 | 0.97 | –0.3 | 0.914 | –0.31 |

Figure 21:
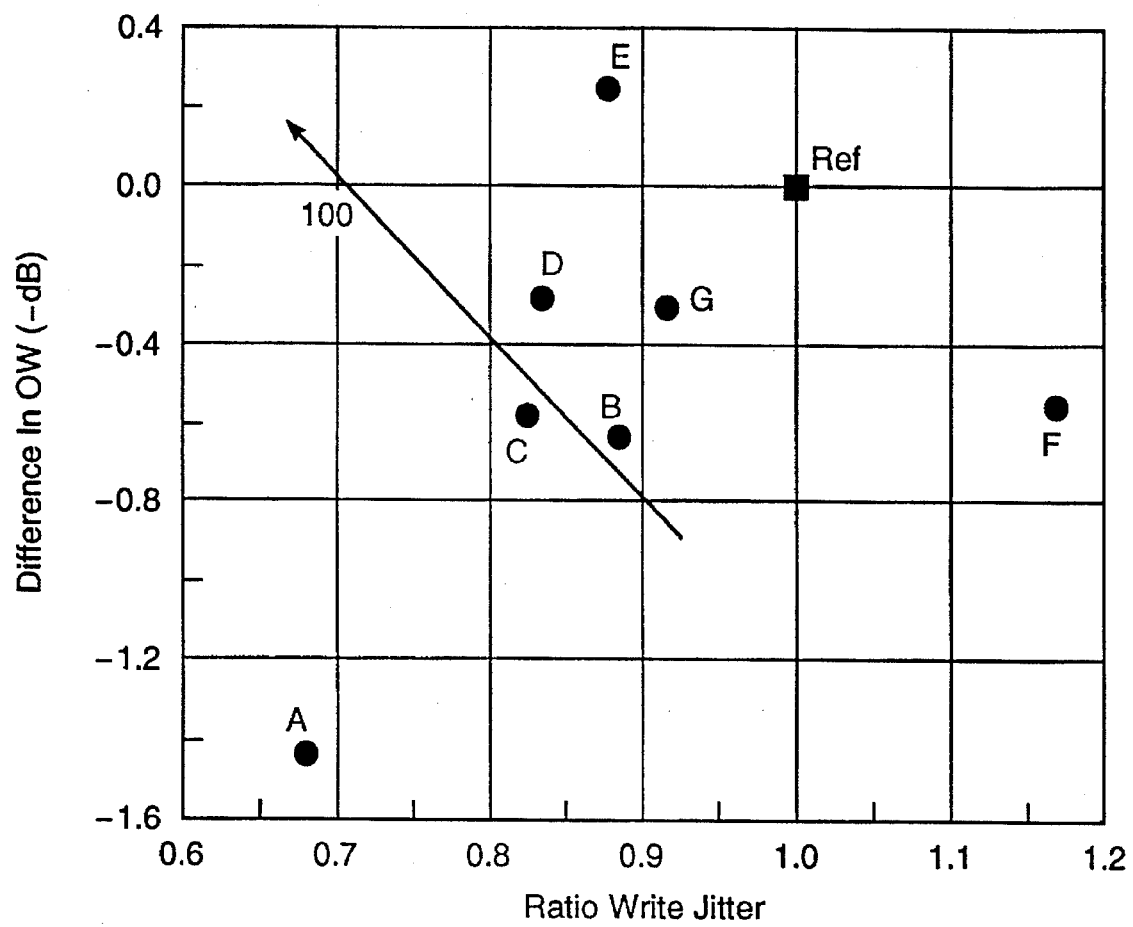
FIG. 21 shows overwrite versus write jitter normalized against a reference standard for various media including media in accordance with the present invention.
Figure 22:
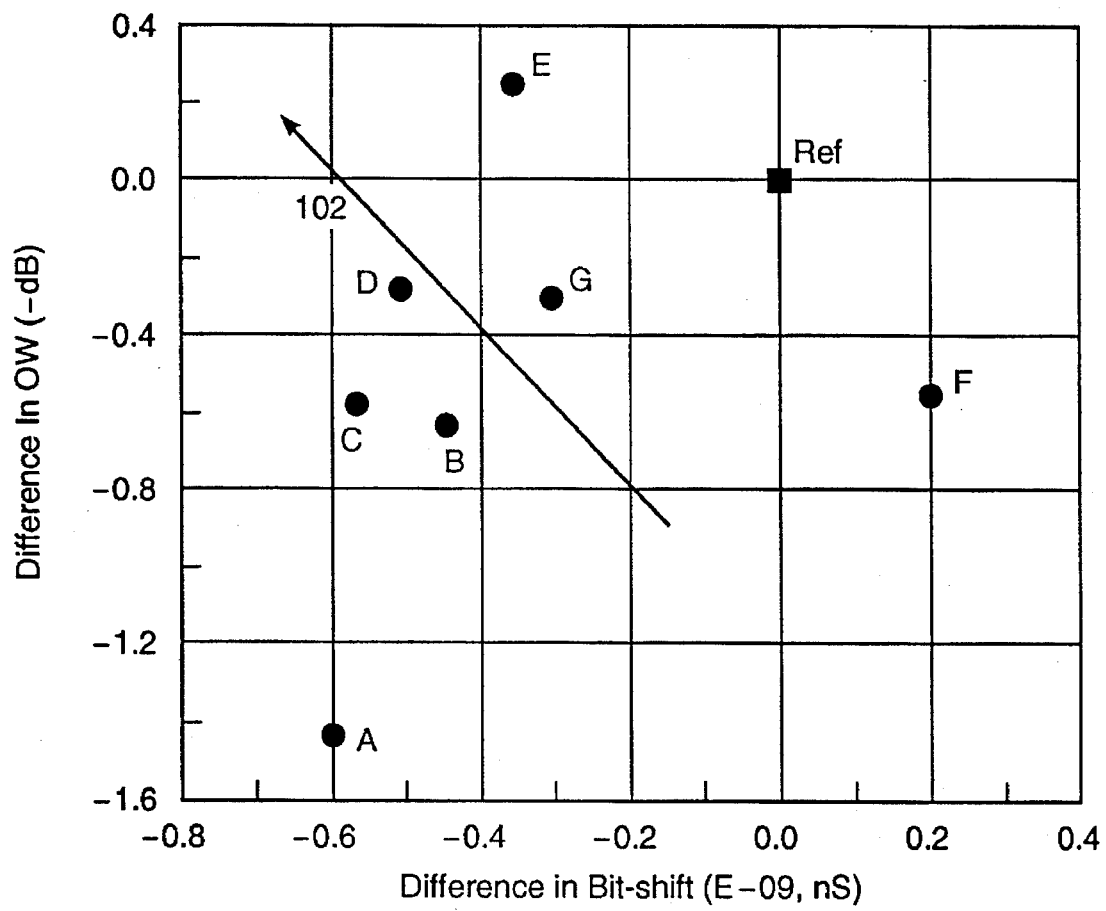
FIG. 22 shows overwrite versus bit shift normalized against a reference standard for various media including media in accordance with the present invention.

**Reference Sample was a commercially available CoCrTa Oriented Media havng Hc = 1920 Oe and Mrt = 2.5 memu/cm2
**PW50 and Write Jitter ratio wrt the reference, and OW and bit-shift is difference wrt the reference FIGS. 21 and 22 show plots of recording results from Table-IV. FIG. 21 shows a plot of OW vs. write jitter for the various disks shown in Table-IV. The left hand corner of the graph as indicated by the tip of the marked arrow 100, is the direction of improvement. As shown, samples "D" and "E" which were sputtered per the teachings of the present invention indicate a clear improvement in OW and write jitter over samples "A" and "G" which follow the prior art. Likewise, FIG. 22 shows a plot of OW vs. bit-shift for these samples. Again, the tip of the arrow marked 102 indicates the direction of improvement. Once again samples "D" and "E" show clear improvement in OW and bit-shift performance over samples "A" and "G".

Figure 23:
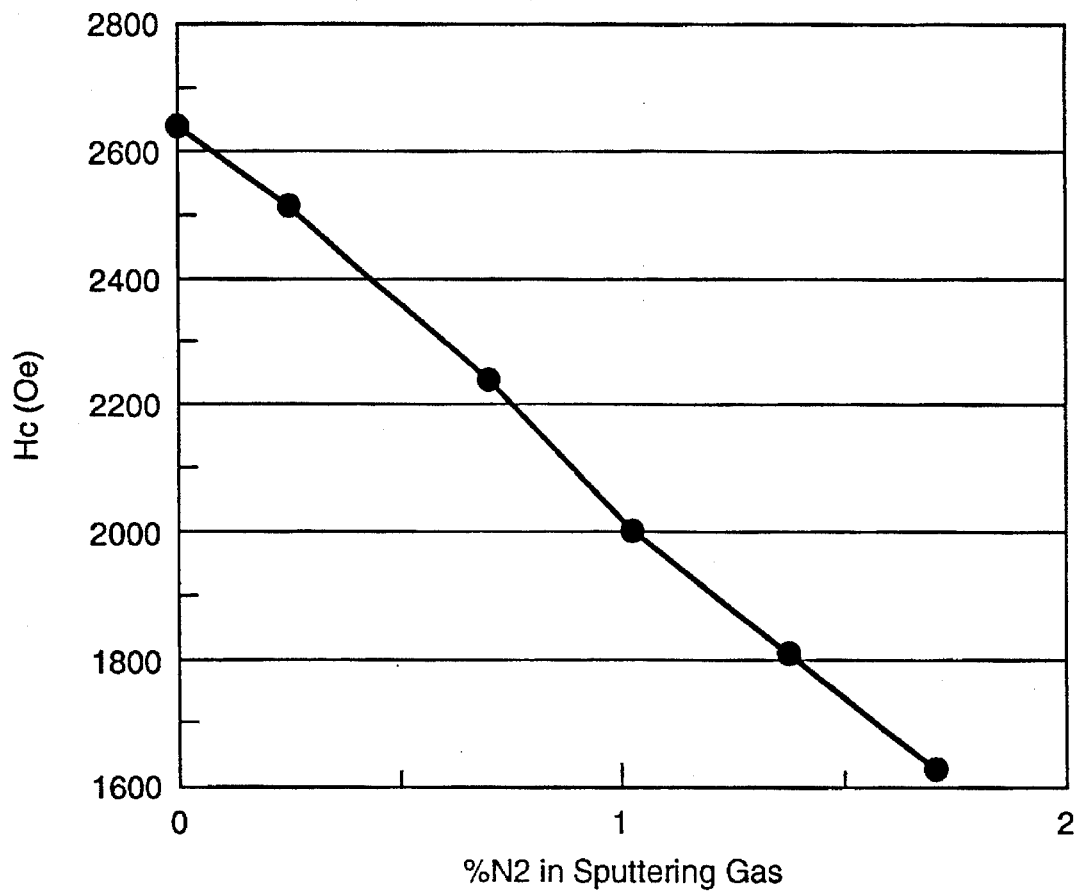
FIG. 23 shows effect of $N_2$ addition during sputtering on the Hc of $CoCr_{11}Pt_{11}$-4%SiO2 media having a NiP-$TiO_2$ nucleation layer.

FIG. 23 shows Hc as a function of % $N_2$ in the sputtering gas during the sputtering of $CoCr_{11}Pt_{11}$-4%$SiO_2$ media which was sputtered at an argon pressure of 15 mTorr over 4%$SiO_2$ magnetic layer is increased from 0 to 0.9%, the write jitter decreases from 0.318 nS to 0.256 nS, and the OW improves from 35.63 to 44.94. As shown in FIG. 23, the Hc of this media drops monotonically as the percentage of $N_2$ increases, and therefore the improvement in OW with increasing percentage of $N_2$ is at least partly due to a drop in Hc. It is interesting to note that while Hc is dropping, the PW50 does not seem to materially change, which seems to indicate that the squareness of these media is very likely increasing with an increasing percentage of $N_2$ in gas. The $CoNi_5Ti_{1.5}Ta_{1.5}B_2Pt_{14}$ alloy which was sputtered under high argon sputtering pressure of 25 μm, and in the presence of higher percentages of $N_2$ in the sputtering gas, exhibited relatively poor overwrite although the write jitter is quite good.

TABLE V

| CoCrPt-4% SiO2 media sputtered over different Nucleation layer | | | | | | | |
|---|---|---|---|---|---|---|---|
| Magnetic Film | Par (mTorr) | Nucl. layer | N2-Gas (%) | Amplitude (mVp-p) | PW50 (nS) | W Jitter (nm) | OW (–dB) |
| CoCr11Pt11-4% SiO2 | 15 | NiP-2% TiO2 | 0 | 0.7907 | 49.55 | 3.98 | 35.63 |
| CoCr11P11-4% SiO2 | 15 | NiP-2% TiO2 | 0.2 | 0.786 | 49.64 | 3.69 | 38.16 |
| CoCr11Pt11-4% SiO2 | 15 | NiP-2% TiO2 | 0.6 | 0.7703 | 49.68 | 3.29 | 42.64 |
| CoCr11Pt11-4% SiO2 | 15 | NiP-2% TiO2 | 0.9 | 0.7753 | 49.81 | 3.2 | 44.94 |
| CoNiTiTaBPt14 | 25 | NiP-1% Al2O3 | 1.4 | 0.7072 | 49.91 | 3.45 | 36.21 | a 300 Å thick NiP-2%$TiO_2$ nucleation layer. The Mrt of this media was maintained at around 1.0 memu/cm$^2$ as suited for magneto-resistive head applications. As can be seen, an extremely high Hc of over 2600 Oe was obtained with 11 atomic percent of platinum in the magnetic alloy. Once again, this is much higher than the Hc observed by Shimizu et al., in their EP and Japanese patent applications, which is only 2000 Oe for 17 at. % of Pt for identical magnetic layer thickness which is estimated to be about 200 Å. Unlike the other magnetic alloy shown in FIG. 5 which have an Mrt of about 2.5 memu/cm2, the Hc of the $CoCr_{11}Pt_{11}$-4%$SiO_2$ media shows monotonic decrease with an increasing percentage of $N_2$ in the gas. We have found though that the proper amount of $N_2$ addition in the gas results in very low media noise while maintaining high squareness.

While the invention has been described above with respect to the specific embodiments, those skilled in the art will appreciate that modifications may be made without departing from the spirit and scope of the invention. For example, the present invention has been described in terms of a media having a single magnetic recording layer. However, in certain applications of the present invention multiple magnetic recording layers may be employed. Therefore, the above specific descriptions are presented as examples of embodiments of the present invention, and are not to be read as limiting the scope of the present invention.

What is claimed is:

1. A magnetic recording media, comprising:
   a non-magnetic substrate;

a nucleation layer, formed on said non-magnetic substrate, comprising a compound of Ni and P and at least one dopant selected from the group comprising oxides and nitrides of Al, Hf, Si, Ta, Ti, and Zr;

a recording layer, formed on said nucleation layer, comprising a CoPt-based alloy and at least one segregant compound selected from the group comprising oxides and nitrides having a bond strength of greater than 90 Kcal/mol., such that the CoPt-based alloy predominantly forms single crystallite magnetic grains of uniform size, said single crystallite magnetic grains having grain boundaries, and further such that said segregant compound is disposed at said grain boundaries;

said recording layer further comprising elemental nitrogen or elemental oxygen at the boundaries of the magnetic grains;

said single crystallite magnetic grains being of a non-zero mean diameter of 500 Å or less, and spaced apart from one another by between 5 Å and 50 Å such that said magnetic recording media exhibits a coercivity of at least 1500 Oe, a coercive squareness and remanent coercive squareness of at least 0.8 each, and a switching field distribution of less than 0.2.

2. The magnetic recording media of claim 1, wherein said single crystallite magnetic grains are spaced apart by a mean distance of 20 Å±10 Å.

3. The magnetic recording media of claim 2, wherein a layer of insulating material having a thickness of at least 10 Å is disposed between pairs of adjacent single crystallite magnetic grains.

4. The magnetic recording media of claim 1, wherein the platinum content of the recording layer is less than or equal to 14 at. %, and the Mrt of the recording layer is 2.5 memu/cm$^2$.

5. The magnetic recording media of claim 1, wherein the platinum content of the recording layer is less than 18 at. %, and the Mrt of the recording layer is 1.0 memu/m$^2$.

6. The magnetic recording media of claim 1, wherein the dopant content of the nucleation layer is less than 10%.

7. The magnetic recording media of claim 1, wherein the media includes only a single magnetic recording layer.

8. The magnetic recording media of claim 1, wherein the segregant compound is selected from the group comprising oxides and nitrides of As, Co, Cr, Dy, Gd, La, Lu, Ni, Os, Pm, Ru, Re, Sc, Se, Si, Sm, Sn, Ta, Tb, Th, Ti, Tm, U, V, W, Y, and Zr having a bond strength of greater than 90 Kcal/mol.

9. The magnetic recording media of claim 5, wherein the mean diameter of the single crystallite magnetic grains is less than 100 Å.

10. The magnetic recording media of claim 6, wherein the compound of Ni and P of the nucleation layer contains nitrogen in an amount less than 10%.

11. The magnetic recording media of claim 6, wherein the compound of Ni and P of the nucleation layer contains oxygen in an amount less than 10%.

12. A vacuum deposition target for sputter deposition of a nucleation layer material onto a substrate, comprising the mixture of a compound of Ni and P with at least one dopant selected from the group comprising oxides and nitrides of Al, Hf, Si, Ta, Ti, and Zr, and inevitable impurities.

13. A vacuum deposition apparatus including the vacuum deposition target of claim 12, further comprising a vacuum deposition target used for sputter deposition of a magnetic recording layer material, comprising a CoPt-based alloy and at least one segregant compound selected from the group comprising oxides and nitrides having a bond strength of greater than 90 Kcal/mol., and inevitable impurities.

14. The vacuum deposition apparatus of claim 13, wherein the segregant compound is selected from the group comprising oxides and nitrides of As, Co, Cr, Dy, Gd, La, Lu, Ni, Os, Pm, Ru, Re, Sc, Se, Si, Sm, Sn, Ta, Tb, Th, Ti, Tm, U, V, W, Y, and Zr having a bond strength of greater than 90 Kcal/mol.

15. A magnetic recording media for magnetically storing data, comprising:

a non-magnetic substrate;

an electroless plated NiP layer formed directly on said substrate having a thickness between 5 and 15 μm to which a selected texture has been applied;

a sputtered amorphous nucleation layer formed directly on said electroless plated NiP layer, said nucleation layer of a thickness between 5 and 100 nm, comprising a mixture of Ni$_3$P and less than 10 wt. % of at least one dopant selected from the group comprising Al$_2$O$_3$ and TiO$_2$, said nucleation layer comprising grains having a mean diameter between 50 and 500 Å which are separated by a non-zero mean distance of less than 50 Å;

a sputtered magnetic recording layer formed directly on said nucleation layer, said recording layer comprising an alloy of Co, Pt, and at least one element selected from the group comprising B, Cr, Ni, Ta, and Ti, said recording layer comprising grains whose size and spacing are determined by the size and spacing of the grains of said nucleation layer, the grains of said recording layer having a mean diameter between 50 and 500 Å which are separated by a non-zero mean distance of less than 50 Å, each grain having a boundary and being substantially surrounded at said boundary by an insulating material of thickness less than 50 Å, said insulating material being selected from the group comprising CoO and SiO$_2$, said recording layer further comprising a nitride of at least one element selected from the group comprising Co, B, Cr, Ni, Ta, and Ti; and a sputtered protective overcoat layer formed directly on said recording layer of thickness less than 300 Å comprised of a material selected from the group comprising hydrogenated carbon and ZrO$_2$.

16. A method of manufacturing a magnetic recording media exhibiting a coercivity of at least 1500 Oe, a coercive squareness and remanent coercive squareness of at least 0.8 each, and a switching field distribution of less than 0.2, comprising the steps of:

providing a vacuum deposition system having a partial pressure of H$_2$O of less than $5.0 \times 10^{-5}$ Torr and an inert gas pressure of less than $20 \times 10^{-3}$ Torr;

introducing into the vacuum deposition system a contributant gas in an amount of at least 0.5 vol. %;

introducing a non-magnetic substrate into the vacuum deposition system;

depositing directly or indirectly onto the non-magnetic substrate a nucleation layer comprising a compound of Ni and P and at least one dopant selected from the group comprising oxides and nitrides of Al, Hf, Si, Ta, Ti, and Zr; and sputter depositing onto the nucleation layer a recording layer comprising a CoPt-based alloy and at least one segregant compound selected from the group comprising oxides and nitrides having a bond strength of greater than 90 Kcal/mol., such that the CoPt-based alloy predominantly forms single crystallite magnetic grains of uniform size, said grains spaced apart by a mean distance of 20 Å±10 Å, said single crystallite magnetic grains having grain boundaries, and further such that said segregant compound is disposed at said grain boundaries;

wherein elements of said contributant gas are introduced from the vacuum deposition system into the recording layer predominantly at the boundaries of the magnetic grains.

17. The method of claim 16, wherein the contributant gas is a gas selected from the group comprising O, N, CO, $CO_2$, NO, $N_2O$.

18. The method of claim 16, further comprising the step of introducing a selected amount of $H_2O$ into the vacuum deposition system such that the $H_2O$ partially decomposes and serves as a source of elemental oxygen, and further such that said recording layer is formed to incorporate said element oxygen at the boundaries of the magnetic grains.

19. The method of claim 16, wherein the vacuum deposition of said nucleation and said recording layers comprises sputtering from sputtering targets, and further wherein the sputtering target from which the recording layer is sputtered has segregant added thereto, and further said sputtering target from which the recording layer is sputtered has an oxygen content of below 2000 ppm before said addition of segregant.

20. The method of claim 16, wherein the segregant compound is selected from the group comprising oxides and nitrides of As, Co, Cr, Dy, Gd, La, Lu, Ni, Os, Pm, Ru, Re, Sc, Se, Si, Sm, Sn, Ta, Tb, Th, Ti, Tm, U, V, W, Y, and Zr having a bond strength of greater than 90 Kcal/mol.

21. A magnetic recording media formed by the method of claim 16.

* * * * *